(12) United States Patent
Matsumura et al.

(10) Patent No.: US 10,586,770 B2
(45) Date of Patent: Mar. 10, 2020

(54) OPTICAL MODULE

(71) Applicant: FUJITSU LIMITED, Kawasaki-shi, Kanagawa (JP)

(72) Inventors: Takayoshi Matsumura, Yokohama (JP); Naoaki Nakamura, Kawasaki (JP); Norio Kainuma, Nagano (JP); Takashi Kubota, Chikuma (JP); Kenji Fukuzono, Kawasaki (JP); Takumi Masuyama, Kawasaki (JP); Yuki Hoshino, Yokohama (JP); Hidehiko Kira, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/180,084

(22) Filed: Nov. 5, 2018

(65) Prior Publication Data

US 2019/0157207 A1 May 23, 2019

(30) Foreign Application Priority Data

Nov. 22, 2017 (JP) ................................ 2017-224499

(51) Int. Cl.
| | | |
|---|---|---|
| *H01L 21/00* | (2006.01) | |
| *H01L 23/538* | (2006.01) | |
| *H01S 5/02* | (2006.01) | |
| *H01L 23/367* | (2006.01) | |
| *H01L 25/075* | (2006.01) | |
| *H01S 5/022* | (2006.01) | |

(Continued)

(52) U.S. Cl.
CPC ........ *H01L 23/5384* (2013.01); *G02B 6/4269* (2013.01); *H01L 23/3677* (2013.01); *H01L 23/5385* (2013.01); *H01L 23/5386* (2013.01); *H01L 23/562* (2013.01); *H01L 25/0756* (2013.01); *H01S 5/0216* (2013.01); *H01S 5/02276* (2013.01)

(58) Field of Classification Search
CPC ............... H01L 23/5384; H01L 23/562; H01L 25/0756; H01L 23/5386; H01L 23/5385; H01L 23/3677; H01S 5/02276; H01S 5/0216
USPC ......................................................... 257/612
See application file for complete search history.

(56) References Cited

U.S. PATENT DOCUMENTS

| | | | | |
|---|---|---|---|---|
| 6,874,910 B2 * | 4/2005 | Sugimoto | ........... | H01L 25/0753 257/98 |
| 8,604,603 B2 * | 12/2013 | Lau | ....................... | H01L 23/055 257/693 |
| 9,063,307 B2 * | 6/2015 | Yabre | ................... | G02B 6/4206 |

(Continued)

FOREIGN PATENT DOCUMENTS

JP         11-260960         9/1999

*Primary Examiner* — Vu A Vu
(74) *Attorney, Agent, or Firm* — Fujitsu Patent Center

(57) ABSTRACT

An optical module includes: a substrate including a through hole, a first chip including a first heating member and disposed in the through hole, a second chip including a second heating member and bonded to a first upper surface of the substrate and a second upper surface of the first chip via bumps, and a first heat sink adhered to a lower surface of the substrate with a first adhesive and adhered to a lower surface of the first chip with a second adhesive, wherein the substrate includes a slit which is provided on a side of a first portion, to which the second chip is bonded, of the substrate with respect to the through hole, and communicates with the through hole.

10 Claims, 18 Drawing Sheets

(51) Int. Cl.
*H01L 23/00* (2006.01)
*G02B 6/42* (2006.01)

(56) References Cited

U.S. PATENT DOCUMENTS 10,008,475 B2 * 6/2018 Chiu .................. H01L 23/13
10,062,664 B2 * 8/2018 Hsieh ................ H01L 23/367

* cited by examiner

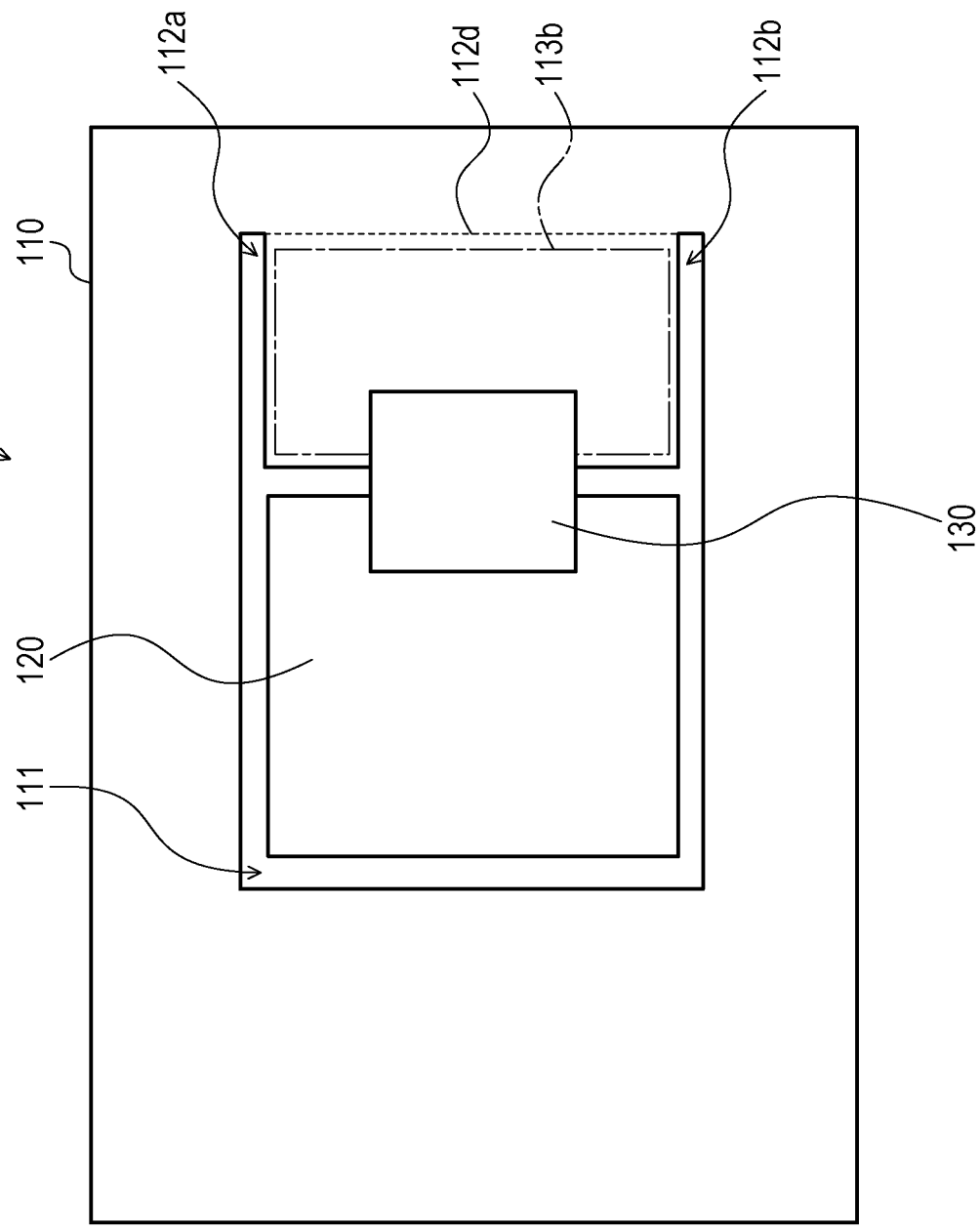

OPTICAL MODULE

CROSS-REFERENCE TO RELATED APPLICATION

This application is based upon and claims the benefit of priority of the prior Japanese Patent Application No. 2017-224499, filed on Nov. 22, 2017, the entire contents of which are incorporated herein by reference.

FIELD

The embodiments discussed herein are related to an optical module.

BACKGROUND

There is an optical module that converts an input electric signal into an optical signal and outputs the converted optical signal.

The related art is disclosed in Japanese Laid-open Patent Publication No. 11-260960.

SUMMARY

According to an aspect of the embodiments, an optical module includes: a substrate including a through hole; a first chip including a first heating member and disposed in the through hole; a second chip including a second heating member and bonded to a first upper surface of the substrate and a second upper surface of the first chip via bumps; and a first heat sink adhered to a lower surface of the substrate with a first adhesive and adhered to a lower surface of the first chip with a second adhesive, wherein the substrate includes a slit which is provided on a side of a first portion, to which the second chip is bonded, of the substrate with respect to the through hole, and communicates with the through hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 18 is a top view illustrating an example of an optical module according to Embodiment 7.

DESCRIPTION OF EMBODIMENTS

For example, there is also a technique in which a stress relief groove is provided in a surface of a relay board disposed to face a mounting board such that the surface faces the mounting board.

However, damage to a circuit is not suppressed in some instances. For example, in a configuration in which a control chip and an optical chip are provided on a substrate, wire bonding for connections among the substrate, the control chip, and the optical chip makes wiring long, which hinders high-speed communications. In contrast to this, a configuration is considered in which an optical chip is provided in a through hole formed in a substrate, and a control chip is bump-bonded to the optical chip and the substrate. According to this configuration, the control chip is pulled due to displacement of the optical chip, for example. A circuit such as the control chip is thus damaged in some instances.

For example, the technology which is directed toward suppression of damage to a circuit may be provided.

In the following, embodiments of an optical module according to the disclosure will be described in detail with reference to the drawings.

Embodiment 1

Example of Optical Module According to Embodiment 1

Figure 1:
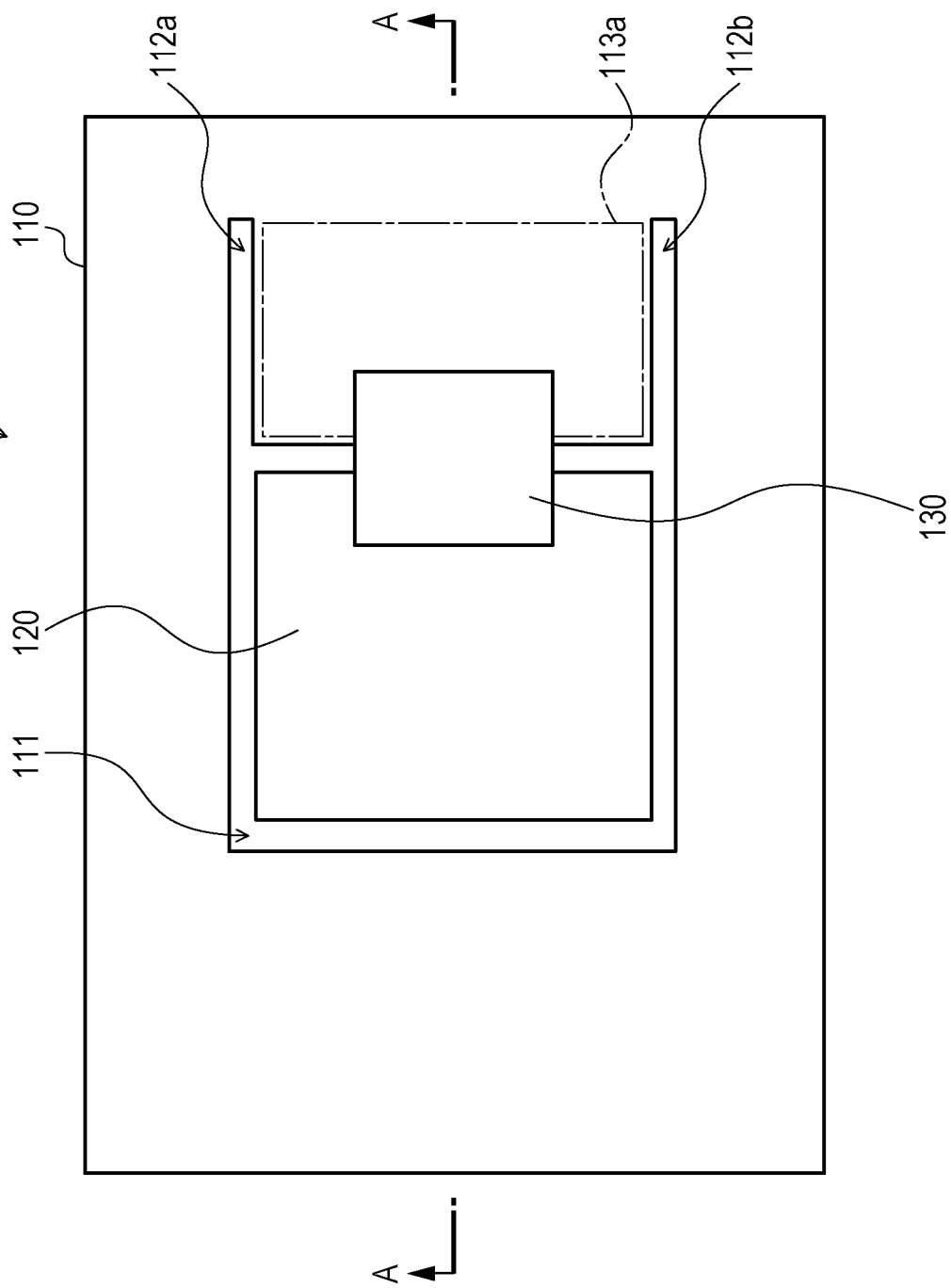
FIG. 1 is a top view illustrating an example of an optical module according to Embodiment 1.

FIG. 1 is a top view illustrating an example of an optical module according to Embodiment 1. An optical module 100 according to Embodiment 1 illustrated in FIG. 1 is, for example, an optical module that converts an input electric signal into an optical signal and outputs the converted optical signal. An example of the optical module 100 is a QSFP module provided at an end portion of a QSFP cable directly coupling server devices. The optical module 100 may be another optical transmission module such as a QSFP+module or an optical transceiver. QSFP stands for Quad Small Form-Factor Pluggable.

As illustrated in FIG. 1, the optical module 100 includes a substrate 110, a Si-Ph chip 120, and a control chip 130. In the following description, a surface in each configuration of the optical module 100 illustrated in FIG. 1 is defined as an upper surface in each configuration of the optical module 100 and a surface opposite to the upper surface in each configuration of the optical module 100 is defined as a lower surface in each configuration of the optical module 100.

The substrate 110 is, for example, a substrate having an electric circuit that outputs an electric signal input to the optical module 100 to the control chip 130. As will be described later, the control chip 130 is bonded to a circuit on the upper surface of the substrate 110 via a bump. The substrate 110 outputs the electric signal input to the optical module 100 to the control chip 130 via the bump between the substrate 110 and the control chip 130. Further, the substrate 110 is formed in, for example, a rectangular plate shape having a predetermined thickness. Further, the substrate 110 is provided with a through hole 111, and cutout portions 112a and 112b.

The through hole 111 is an opening provided at a predetermined position (for example, a substantially central portion) of the substrate 110 so as to penetrate from the upper surface to the lower surface of the substrate 110. Further, the through hole 111 is formed to be larger than the Si-Ph chip 120 such that the Si-Ph chip 120 is disposed inside the through hole 111.

Each of the cutout portion 112a and the cutout portion 112b is a slit formed by cutting out a part of the substrate 110. Each of the cutout portion 112a and the cutout portion 112b is, for example, a slit penetrating from the upper surface to the lower surface of the substrate 110. Further, the cutout portion 112a and the cutout portion 112b are provided on a side of a portion, to which the control chip 130 is bonded, of the substrate 110 with respect to the through hole 111. In the case of the example illustrated in FIG. 1, the portion, to which the control chip 130 is bonded, of the substrate 110 is on the right side of the through hole 111 in FIG. 1. In the case of the example illustrated in FIG. 1, accordingly, the cutout portion 112a and the cutout portion 112b are provided on the right-side portion of the substrate 110 with respect to the through hole 111 in FIG. 1.

Further, the cutout portion 112a and the cutout portion 112b are provided to communicate with the through hole 111. For example, the cutout portion 112a and the cutout portion 112b are provided to communicate with the through hole 111 from a portion opposite to the through hole 111 as seen from the portion, to which the control chip 130 is bonded, of the substrate 110. Further, the cutout portion 112a and the cutout portion 112b are provided on both sides of the portion to which the control chip 130 is bonded, with the portion, to which the control chip 130 is boded, of the substrate 110 sandwiched therebetween, on the substrate 110.

A deformation portion 113a is a portion of the substrate 110 sandwiched between the cutout portion 112a and the cutout portion 112b, and includes the portion, to which the control chip 130 is bonded, of the substrate 110. By providing the cutout portions 112a and 112b, the deformation portion 113a including the portion, to which the control chip 130 is bonded, of the substrate 110 is displaced with ease in accordance with control chip 130-side force to be applied to the portion, to which the control chip 130 is bonded, of the substrate 110. The control chip 130-side force is, for example, force to be applied from the control chip 130 to the substrate 110 via the bump and force of the control chip 130 to push the substrate 110. For example, as will be described later, in a case where the control chip 130 tends to be displaced toward the lower surface side, the control chip 130 is subjected to force (drag) directed from the substrate 110 to the upper surface side. The control chip 130-side force may be force to be applied from the control chip 130 to the substrate 110 by reaction of the force applied from the substrate 110 to the control chip 130.

For example, the substrate 110 may be realized by providing an electronic component such as an integrated circuit, a resistor, a capacitor, or a transistor on an insulator base material such as an epoxy resin, and forming the through hole 111 and the cutout portions 112a and 112b by cutting using cutting means such as a drill. The substrate 110 is an example of a substrate according to the disclosure.

As described above, the cutout portion 112a and the cutout portion 112b are formed to communicate with the through hole 111, so that working efficiency is improved in the case of forming the through hole 111 and the cutout portions 112a and 112b with the cutting means, for example. For example, in the case of forming the through hole 111 and the cutout portions 112a and 112b by cutting, the through hole 111 and the cutout portions 112a and 112b are consecutively formed without pulling the cutting means out of the substrate 110.

The Si-Ph chip 120 is, for example, a silicon photonics chip having an LD, an optical waveguide, an optical modulator, and the like. LD stands for Laser Diode. For example, the LD of the Si-Ph chip 120 emits light to the optical waveguide of the Si-Ph chip 120. The light incident on the optical waveguide of the Si-Ph chip 120 is modulated by the optical modulator of the Si-Ph chip 120. The optical modulator of the Si-Ph chip 120 modulates the light incident on the optical waveguide of the Si-Ph chip 120, under the control of the control chip 130 bonded to the upper surface of the Si-Ph chip 120 via the bump. An example of the optical modulator of the Si-Ph chip 120 is a Mach-Zehnder type modulator. The light modulated by the optical modulator of the Si-Ph chip 120 is output to the outside of the optical module 100 via the optical waveguide of the Si-Ph chip 120 or an optical waveguide, such as an optical fiber, provided outside the Si-Ph chip 120.

Further, the Si-Ph chip 120 is formed in, for example, a rectangular plate shape that has a predetermined thickness and is smaller than the through hole 111. Further, the Si-Ph chip 120 is disposed inside the through hole 111. The upper surface of the Si-Ph chip 120 and the upper surface of the substrate 110 are thus made flush with each other (at a position in a depthwise direction of FIG. 1), so that the control chip 130 is placed across the substrate 110 and the Si-Ph chip 120 as will be described later.

The Si-Ph chip 120 may be realized with, for example, a silicon photonics chip in which various optical elements and electronic elements are integrated on a silicon substrate. The Si-Ph chip 120 is an example of a first chip according to the disclosure. Each of the LD and the optical modulator of the Si-Ph chip 120 is an example of a first heating member according to the disclosure.

The control chip 130 is, for example, a flip chip in which terminals are provided on the lower surface. The control chip 130 is bonded to a circuit on the upper surface of the substrate 110 and a circuit on the upper surface of the Si-Ph chip 120 via bumps. For example, the control chip 130 is provided across the substrate 110 and the Si-Ph chip 120, and has a bridge structure electrically coupled to the substrate 110 and the Si-Ph chip 120 via the bumps.

The bridge structure of the control chip 130 allows a reduction in wiring length between the substrate 110 and the control chip 130 as compared with, for example, a case where the substrate 110 and the control chip 130 are electrically coupled by wire bonding. The bridge structure of the control chip 130 therefore improves communication performance between the substrate 110 and the control chip 130.

Further, the bridge structure of the control chip 130 also allows a reduction in wiring length between the Si-Ph chip 120 and the control chip 130 as compared with, for example, a case where the Si-Ph chip 120 and the control chip 130 are electrically coupled by wire bonding. The bridge structure of the control chip 130 therefore improves communication performance between the Si-Ph chip 120 and the control chip 130.

Further, the bridge structure of the control chip 130 also allows direct transfer of portion of heat of the control chip 130 to the substrate 110, thereby reducing the heat of the control chip 130 to be transferred from the control chip 130 to the Si-Ph chip 120. The bridge structure of the control chip 130 therefore lowers a temperature of the Si-Ph chip 120. For example, the bridge structure of the control chip 130 lowers a temperature of the LD of the Si-Ph chip 120.

Further, the bridge structure of the control chip 130 also allows transfer of heat of the Si-Ph chip 120 to the substrate 110 via the control chip 130. The bridge structure of the control chip 130 therefore lowers a temperature of the Si-Ph chip 120. For example, the bridge structure of the control chip 130 lowers temperatures of the LD and optical modulator of the Si-Ph chip 120.

For example, the control chip 130 may be realized by providing an electronic component such as an integrated circuit, a resistor, a capacitor, or a transistor on an insulator base material such as an epoxy resin. The control chip 130 is an example of a second chip according to the disclosure. The integrated circuit of the control chip 130 is an example of a second heating member according to the disclosure.

Figure 2:
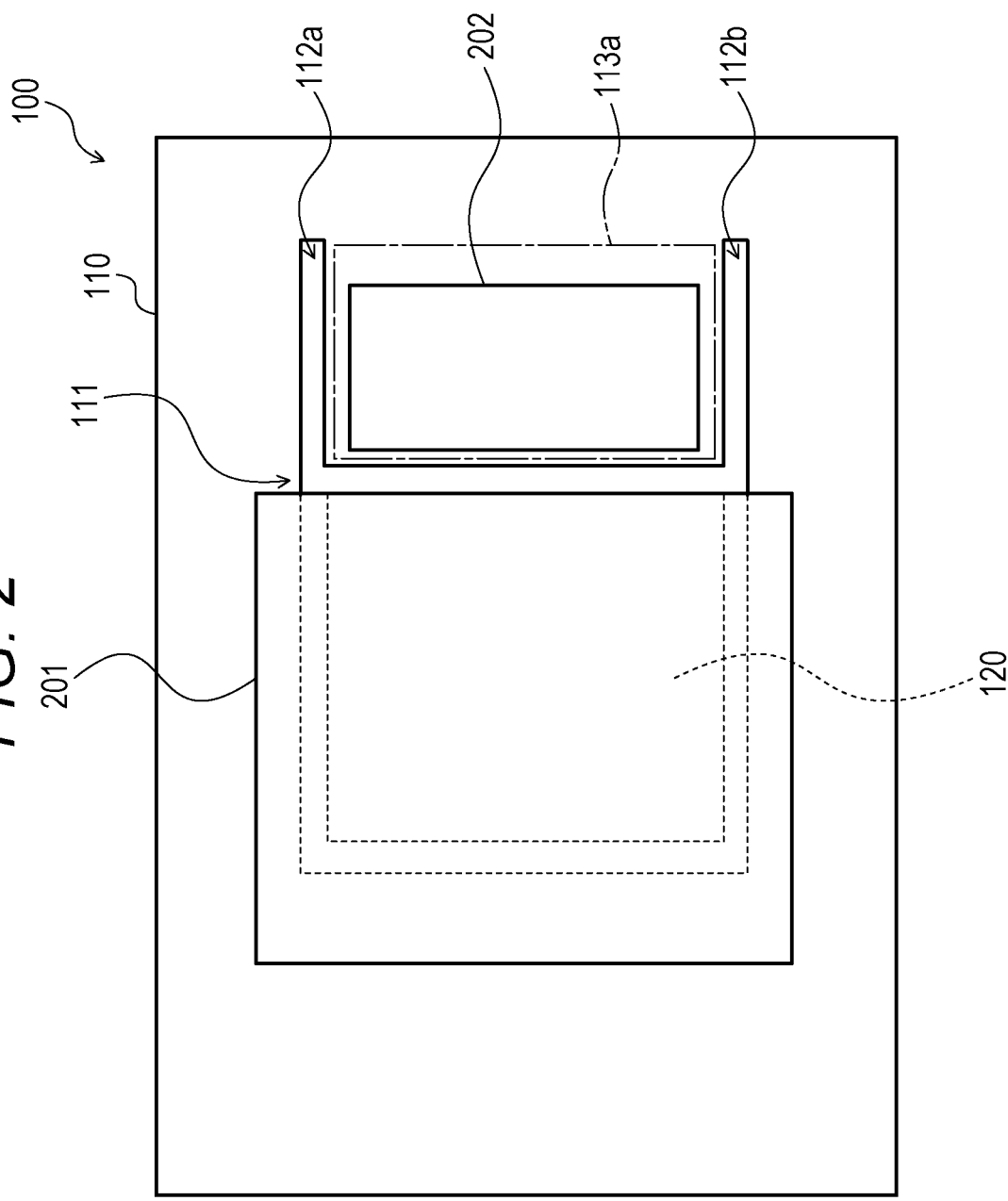
FIG. 2 is a bottom view illustrating an example of the optical module according to Embodiment 1.

FIG. 2 is a bottom view illustrating an example of the optical module according to Embodiment 1. In FIG. 2, the same reference numerals are given to the same configurations as those in FIG. 1, and the description thereof will be omitted.

As illustrated in FIG. 2, the optical module 100 includes a heat sink 201 provided on the lower surface of the optical module 100. The heat sink 201 is provided over the Si-Ph chip 120 and a peripheral portion of the through hole 111 in the substrate 110, and is adhered to each of the substrate 110 and the Si-Ph chip 120. The heat sink 201 thus fixes the Si-Ph chip 120 to the substrate 110 and maintains the state in which the Si-Ph chip 120 is disposed inside the through hole 111. Further, with this, the heat of the Si-Ph chip 120 is transferred to the substrate 110 or the outside via the heat sink 201. The heat sink 201 therefore lowers the temperature of the Si-Ph chip 120. For example, the heat sink 201 lowers the temperature of the LD of the Si-Ph chip 120.

Further, as illustrated in FIG. 2, the heat sink 201 may be provided to avoid the lower surface of the deformation portion 113a. With this, in a case where the deformation portion 113a tends to be displaced toward the lower surface side, the heat sink 201 does not hinder the displacement of the deformation portion 113a. The deformation portion 113a is thus displaced toward the lower surface side with ease. The heat sink 201 is an example of a first heat sink according to the disclosure.

Further, is illustrated in FIG. 2, a heat sink 202 different from the heat sink 201 may be provided on the lower surface of the deformation portion 113a. The heat sink 202 is provided to fall within a range of the lower surface of the deformation portion 113a. With this, in the case where the deformation portion 113a tends to be displaced toward the lower surface side, the heat sink 202 is also displaced toward the lower surface side in accordance with the displacement of the deformation portion 113a. In the case where the deformation portion 113a tends to be displaced toward the lower surface side, the heat sink 202 therefore does not hinder the displacement of the deformation portion 113a. The deformation portion 113a is thus displaced toward the lower surface side with ease. Further, by providing the heat sink 202, the heat of the control chip 130 is transferred to the heat sink 202 via the substrate 110. The heat sink 202 therefore lowers the temperature of the control chip 130. The heat sink 202 is an example of a second heat sink according to the disclosure.

Figure 3:
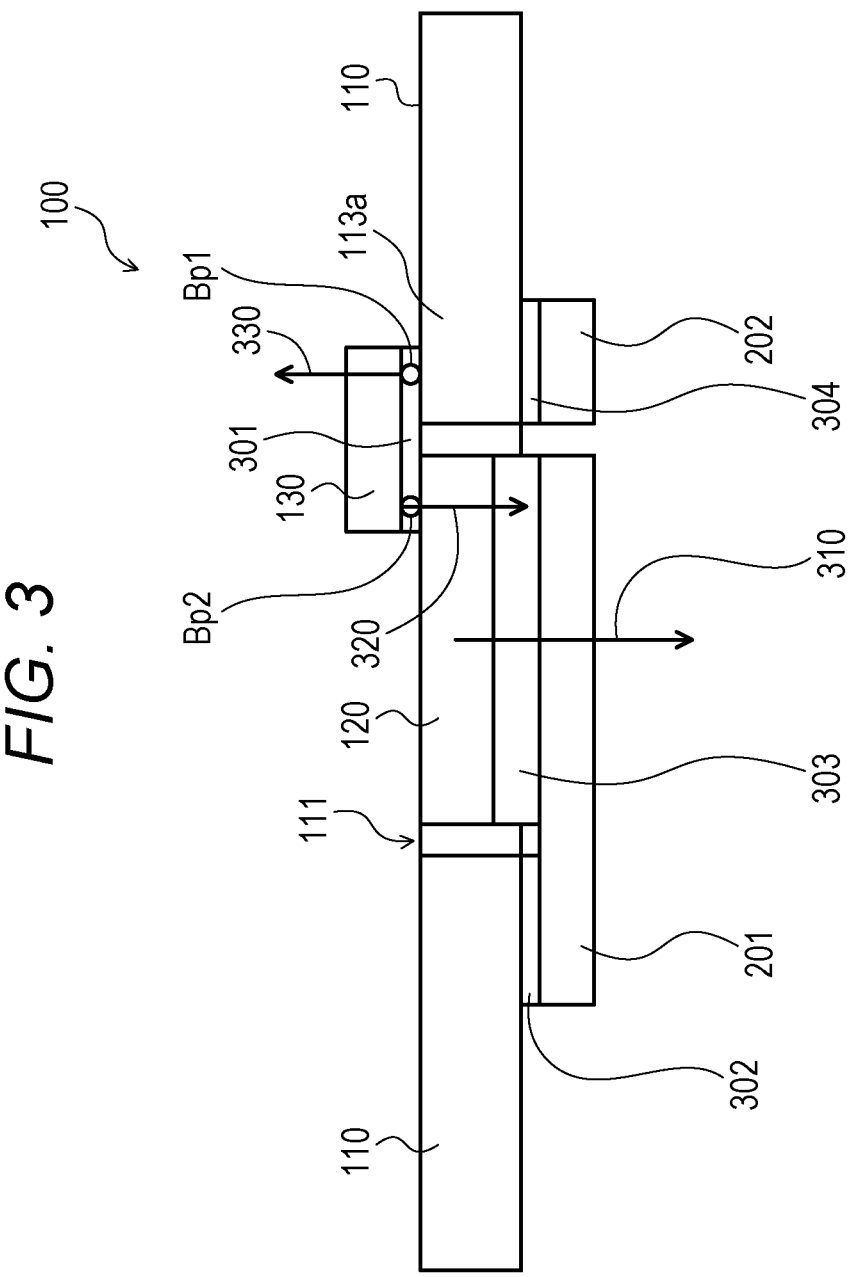
FIG. 3 is a sectional view illustrating an example of the optical module according to Embodiment 1.

FIG. 3 is a sectional view illustrating an example of the optical module according to Embodiment 1. FIG. 3 illustrates an example of a case where a cross-section of the optical module 100 taken along line A-A in FIG. 1 is seen from the lower side toward the upper side in FIG. 1. FIG. 3 also illustrates, for example, an example of a cross-section of the optical module 100 before an adhesive on the lower surface of the Si-Ph chip 120 is cured. In FIG. 3, the same reference numerals are given to the same configurations as those in FIG. 1 and FIG. 2, and the description thereof is omitted.

As illustrated in FIG. 3, the control chip 130 is bump-bonded to the circuit on the upper surface of the substrate 110 by the bump Bp1, and is bump-bonded to the circuit on the upper surface of the Si-Ph chip 120 by the bump Bp2. Further, the control chip 130 may be adhered to the upper surface of the substrate 110 and the upper surface of the Si-Ph chip 120 with an adhesive 301. By providing the adhesive 301, the control chip 130 is reinforced so as to be less prone to being separated from the substrate 110 and the Si-Ph chip 120.

The heat sink 201 is adhered to the lower surface of the substrate 110 with an adhesive 302, and is adhered to the lower surface of the Si-Ph chip 120 with an adhesive 303. Further, in the case of providing the heat sink 202, the heat sink 202 is adhered to the lower surface of the deformation portion 113a with an adhesive 304. An example of each of the adhesives 301 to 304 is liquid curable resin such as epoxy resin. Further, in consideration of the material of the substrate 110 and the material of the Si-Ph chip 120, the adhesives 302 and 304 for bonding the heat sinks 201 and 202 to the substrate 110 may be different in kind from the adhesive 303 for bonding the heat sink 201 to the Si-Ph chip 120.

For example, in manufacturing the optical module 100, the adhesive 303 is provided to make the upper surface of the substrate 110 flush with the upper surface of the Si-Ph chip 120 (in a vertical direction of FIG. 3) such that the control chip 130 is bump-bonded to the substrate 110 and the Si-Ph chip 120 with ease. However, the adhesive 303 is shrunk when being cured. Further, when the adhesive 303 is cured, the Si-Ph chip 120 is pulled by the cured adhesive 303. The Si-Ph chip 120 is thus subjected to force directed to the heat sink 201 side, that is, the lower surface side, as indicated by an arrow 310. The Si-Ph chip 120 is therefore displaced toward the lower surface side.

The Si-Ph chip 120 pulls the control chip 130 toward the lower surface side via the bump Bp2 when being displaced toward the lower surface side, for example. With this, the bonded portion of the control chip 130 to the bump Bp2 is subjected to force directed to the lower surface side as indicated by an arrow 320, so that the control chip 130 tends to be displaced toward the lower surface side. On the other hand, in the case where the control chip 130 tends to be displaced toward the lower surface side, the bonded portion of the control chip 130 to the bump Bp1 is subjected to force (drag) directed from the substrate 110 to the upper surface side via the bump Bp1 as indicated by an arrow 330. Further, the force indicated by the arrow 320 and the force indicated by the arrow 330 generate stress (shearing stress) at the control chip 130.

It is assumed herein that the portion, to which the control chip 130 is bonded, of the substrate 110 is not displaced toward the lower surface side. In this case, when the Si-Ph chip 120 is displaced toward the lower surface side so that the force indicated by the arrow 320 is generated at the control chip 130, the force generated at the control chip 130 as indicated by the arrow 330 is not reduced and, therefore, the stress generated at the control chip 130 is not relieved. Further, the control chip 130 is sometimes damaged by the stress generated at the control chip 130 when the Si-Ph chip 120 is displaced toward the lower surface side. For example, in a case where an electric circuit formed of a thin metal film is provided on the lower surface of the control chip 130, this electric circuit is sometimes damaged when the stress is generated at the control chip 130. If the control chip 130 is damaged, the optical module 100 fails to operate normally, for example.

Figure 4:
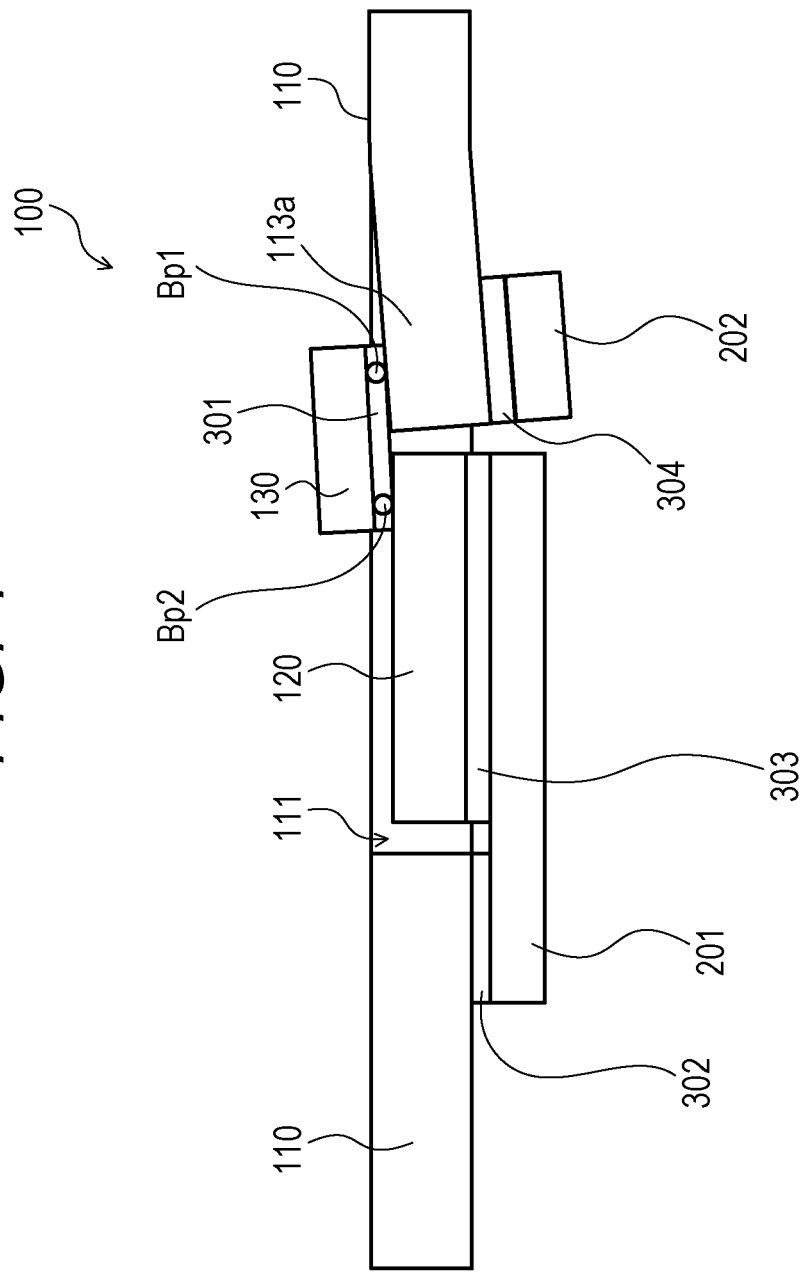
FIG. 4 is a sectional view illustrating an example of the optical module in a case where a Si-Ph chip is displaced toward a lower surface side according to Embodiment 1.

FIG. 4 is a sectional view illustrating an example of the optical module in the case where the Si-Ph chip is displaced toward the lower surface side according to Embodiment 1. FIG. 4 illustrates, for example, an example of a case where a cross-section of the optical module 100 taken along line A-A in FIG. 1 is seen from the lower side toward the upper side in FIG. 1 with the Si-Ph chip 120 displaced toward the lower surface side. FIG. 4 also illustrates, for example, an example of a cross-section of the optical module 100 after the adhesive 303 on the lower surface of the Si-Ph chip 120 is cured. In FIG. 4, the same reference numerals are given to the same configurations as those in FIG. 3, and the description thereof will be omitted.

As described above, in the optical module 100, the cutout portions 112a and 112b are provided in the substrate 110, so that the deformation portion 113a is displaced toward the lower surface side with ease in accordance with the control chip 130-side force to be applied to the portion, to which the control chip 130 is bonded, of the substrate 110. The state in which the deformation portion 113a is displaced toward the lower surface side with ease refers to, for example, a state in which the deformation portion 113a and the portion therearound of the substrate 110 are bent to a side (the lower side of FIG. 4) opposite to the upper surface side of the substrate 110 with ease.

When the deformation portion 113a is formed to be displaced toward the lower surface side with ease, as illustrated in FIG. 4, the deformation portion 113a is bent toward the lower surface side so as to follow the displacement of the Si-Ph chip 120 toward the lower surface side. The deformation portion 113a is thus displaced toward the lower surface side. Further, the force indicated by the arrow 330 in FIG. 3, that is, the drag to be applied from the substrate 110 to the control chip 130 is reduced by an amount of the displacement of the deformation portion 113a toward the lower surface side. The optical module 100 thus relieves the stress generated at the control chip 130 when the Si-Ph chip 120 is displaced toward the lower surface side, and therefore suppresses damage to the control chip 130 due to this stress.

As described above, in the optical module 100 according to Embodiment 1, the Si-Ph chip 120 is provided in the through hole 111 formed in the substrate 110, and the control chip 130 is bump-bonded to the Si-Ph chip 120 and the substrate 110, so that a reduction in wiring length is achieved. The reduction in wiring length includes, for example, a reduction in wiring length between the substrate 110 and the control chip 130, and a reduction in wiring length between the control chip 130 and the Si-Ph chip 120. The reduction in wiring length enables, for example, high-speed communications among the substrate 110, the control chip 130, and the Si-Ph chip 120, and improves the light transmission performance of the optical module 100.

Further, according to the optical module 100, a fixing member for fixing a position of the Si-Ph chip 120 relative to the substrate 110 may be realized with the heat sink 201 for heat radiation in such a manner that the substrate 110 and the Si-Ph chip 120 are adhered to the heat sink 201.

Further, according to the optical module 100, the deformation portion 113a, to which the control chip 130 is bonded, of the substrate 110 is displaced toward the lower surface side of the substrate 110 with ease in such a manner that the cutout portions 112a and 112b are provided in the substrate 110 so as to communicate with the through hole 111. With this, for example, even when the Si-Ph chip 120 is displaced toward the lower surface side due to the shrinkage of the adhesive 303, the deformation portion 113a is also displaced toward the lower surface side so as to follow the displacement of the Si-Ph chip 120. The optical module 100 thus relieves stress to be generated at the control chip 130 or the like, and therefore suppresses damage to the circuit such as the control chip 130.

Embodiment 2

With respect to Embodiment 2, portions different from those in Embodiment 1 will be described. Embodiment 2 to be described below is an example of a case where, as a cutout portion in the substrate 110, a slit is provided between the upper surface and the lower surface of the substrate 110 in parallel with the upper surface of the substrate 110.

Example of Optical Module According to Embodiment 2

Figure 5:
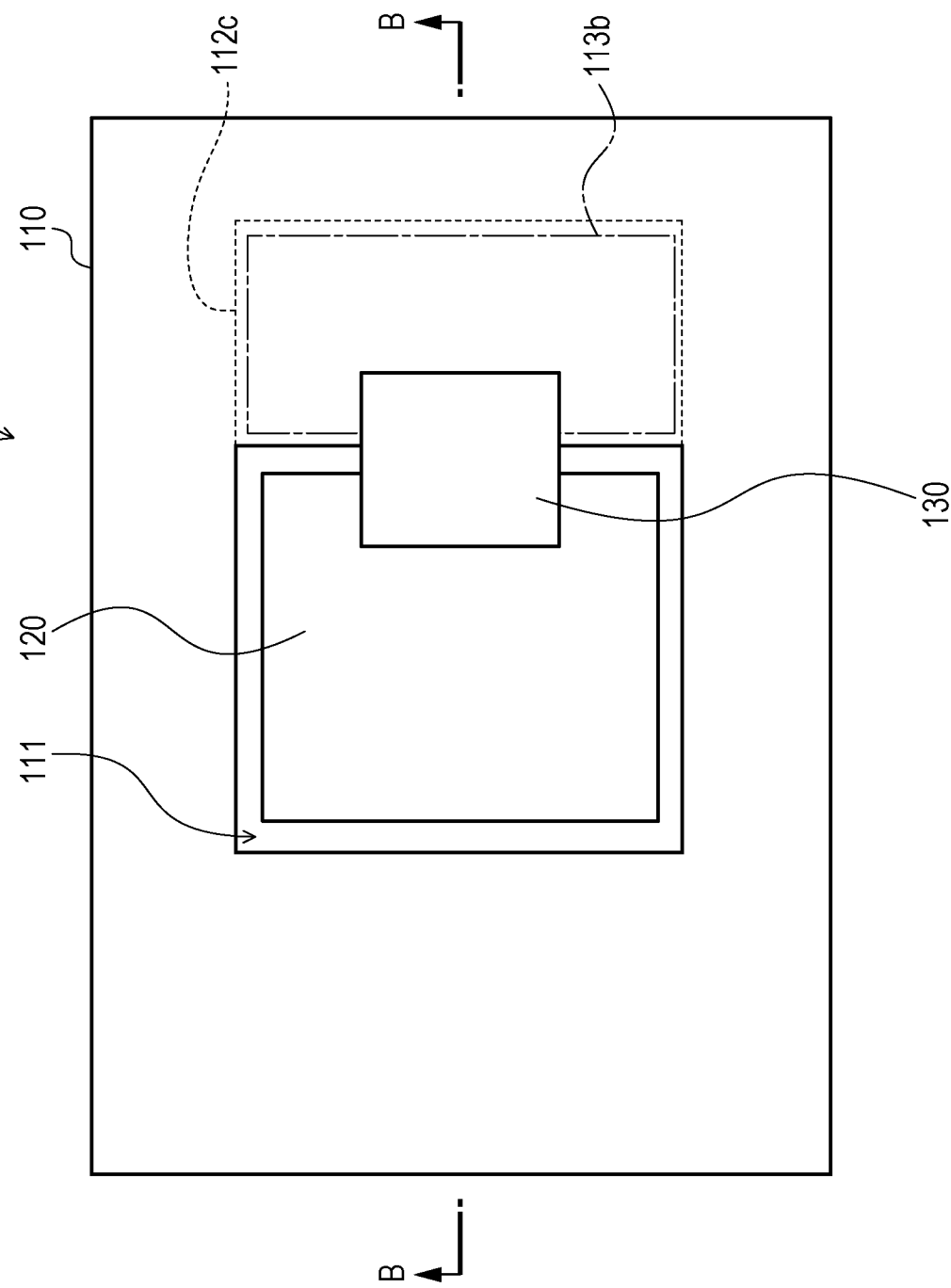
FIG. 5 is a top view illustrating an example of an optical module according to Embodiment 2.

FIG. 5 is a top view illustrating an example of the optical module according to Embodiment 2. In FIG. 5, the same reference numerals are given to the same configurations as those in FIG. 1, and the description thereof will be omitted. In the optical module 100 according to Embodiment 2 illustrated in FIG. 5, the substrate 110 is provided with a cutout portion 112c instead of the cutout portions 112a and 112b illustrated in, for example, FIG. 1.

The cutout portion 112c is a slit provided between the upper surface and the lower surface of the substrate 110 in parallel with the upper surface of the substrate 110. Further, the cutout portion 112c is provided to extend rightward in FIG. 5, from the through hole 111, that is, toward the portion to which the control chip 130 is bonded, from the through hole 111. The cutout portion 112c is also provided on the lower surface side of the portion, to which the control chip 130 is bonded, of the substrate 110.

By providing the cutout portion 112c, a deformation portion 113b is displaced toward the lower surface side with ease. The deformation portion 113b is a portion of the substrate 110 where the cutout portion 112c is provided on the lower surface side, and includes the portion, to which the control chip 130 is bonded, of the substrate 110. For example, the cutout portion 112c may be provided such that the deformation portion 113b includes the portion, to which the control chip 130 is bonded, of the substrate 110.

For example, the substrate 110 according to Embodiment 2 may be realized by providing an electronic component such as an integrated circuit on an insulator base material such as epoxy resin, forming the through hole 111 by cutting using cutting means such as a drill, and forming the cutout portion 112c by cutting from the side of the cut through hole 111.

As described above, the cutout portion 112c is formed to communicate with the through hole 111, so that the cutout portion 112c is formed with good efficiency, for example. It is assumed that, for example, the cutout portion 112c is formed by cutting. In this case, a range to be cut in a case of forming the cutout portion 112c by cutting from a portion other than the through hole 111 is larger than a range to be cut in a case of forming the cutout portion 112c by cutting from the through hole 111. Accordingly, the range to be cut for forming the cutout portion 112c is reduced, and the cutout portion 112c is formed with good efficiency in such a manner that the cutout portion 112c is formed to communicate with the through hole 111, for example. Further, the range to be cut for forming the cutout portion 112c is reduced, so that a reduction in strength of the substrate 110 due to the provision of the cutout portion 112c is suppressed.

Figure 6:
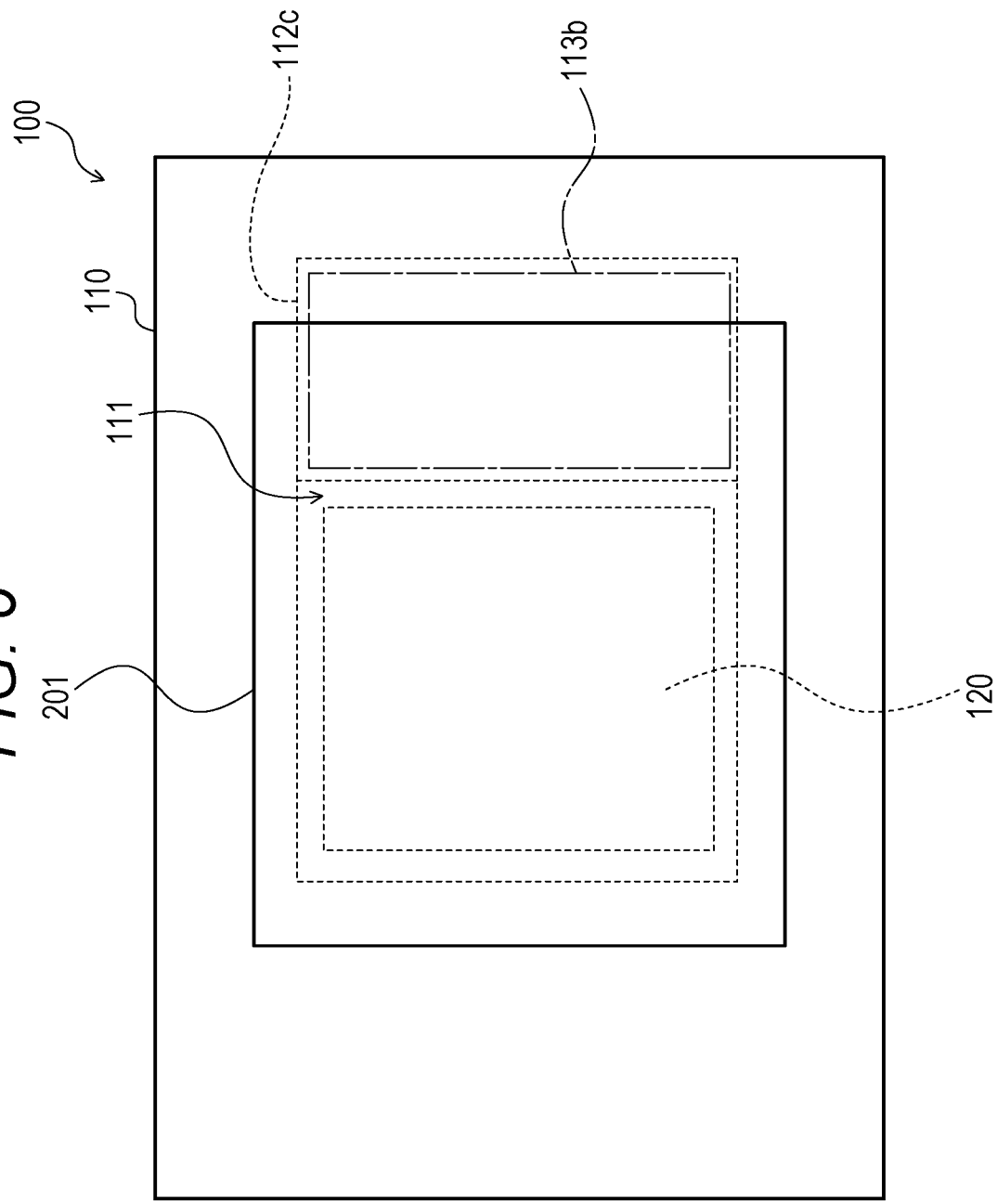
FIG. 6 is a bottom view illustrating an example of the optical module according to Embodiment 2.

FIG. 6 is a bottom view illustrating an example of the optical module according to Embodiment 2. In FIG. 6, the same reference numerals are given to the same configurations as those in FIG. 2 and FIG. 5, and the description thereof is omitted. As illustrated in FIG. 6, in the optical module 100 according to Embodiment 2, the heat sink 201 may be provided on the lower surface side of the deformation portion 113b, that is, the lower surface side of the portion, to which the control chip 130 is bonded, of the substrate 110. The heat sink 201 thus provided as illustrated in FIG. 6 produces similar effects to those of the heat sink 201 and the heat sink 202 provided as illustrated in FIG. 2.

Further, as will be described later, in the case of providing the cutout portion 112c, the cutout portion 112c serves as a clearance allowing the displacement of the deformation portion 113b toward the lower surface side. Therefore, the heat sink 201 does not hinder this displacement. The cutout portion 112c thus allows the deformation portion 113b to be displaced toward the lower surface side with ease.

Figure 7:
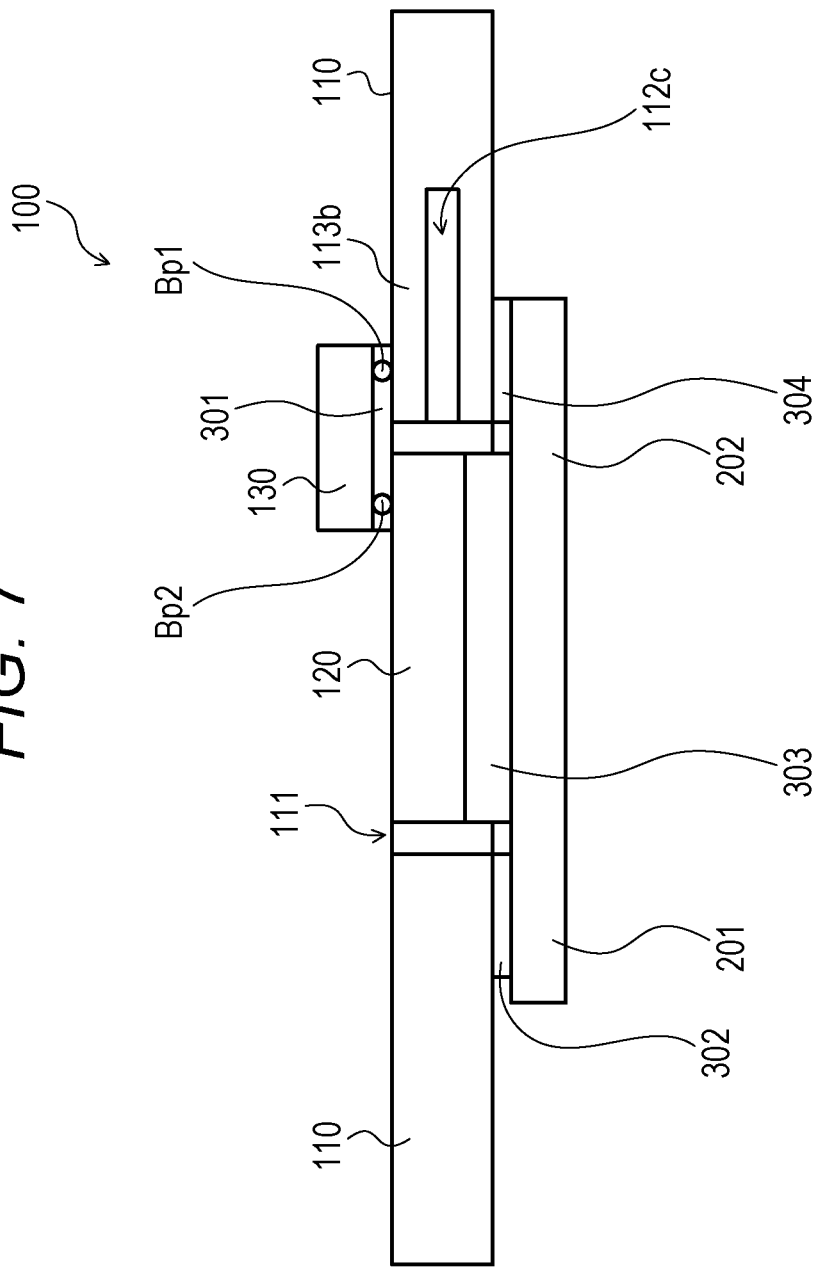
FIG. 7 is a sectional view illustrating an example of the optical module according to Embodiment 2.

FIG. 7 is a sectional view illustrating an example of the optical module according to Embodiment 2. FIG. 7 illustrates an example of a case where a cross-section of the optical module 100 taken along line B-B in FIG. 5 is seen from the lower side toward the upper side in FIG. 5. Further, FIG. 7 also illustrates, for example, an example of a cross-section of the optical module 100 before the adhesive 303 on the lower surface of the Si-Ph chip 120 is cured. In FIG. 7, the same reference numerals are given to the same configurations as those in FIG. 3, FIG. 5, and FIG. 6, and the description thereof is omitted.

Figure 8:
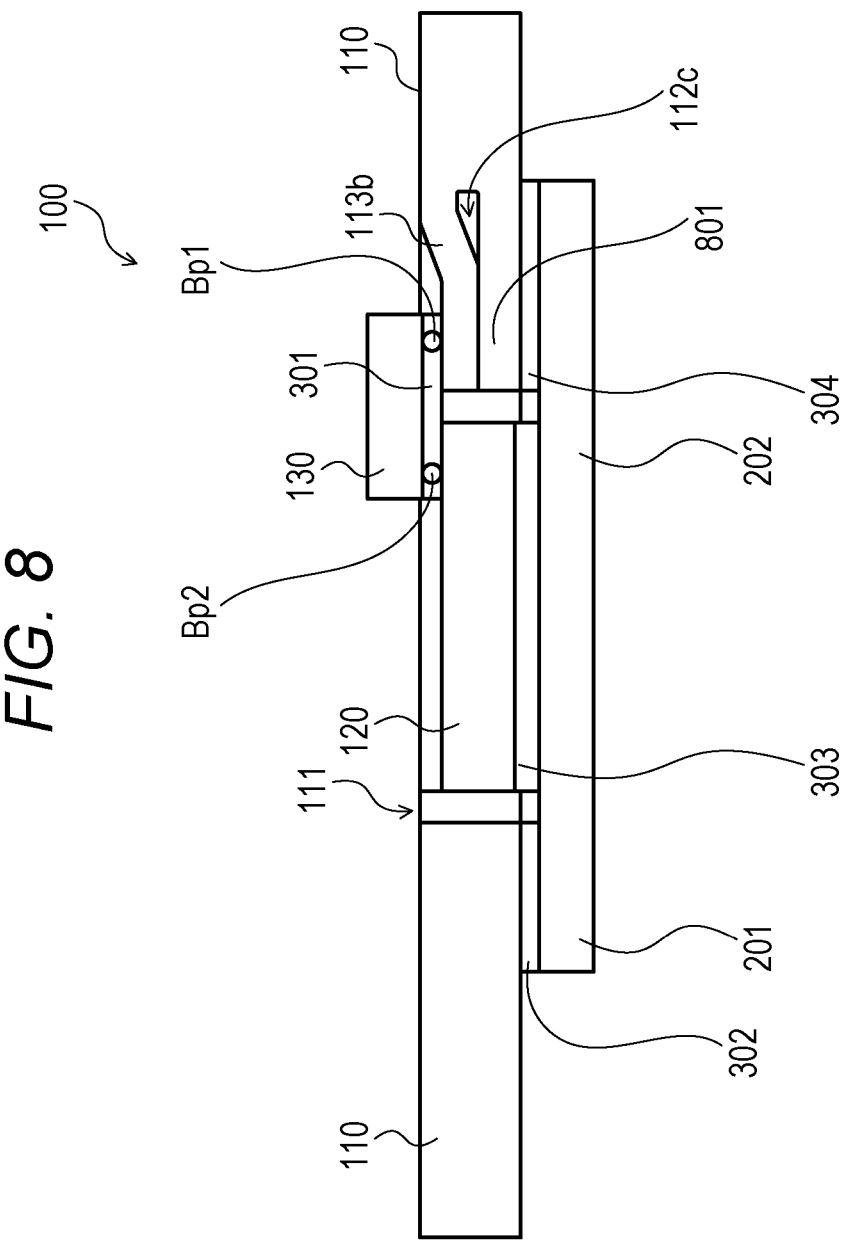
FIG. 8 is a sectional view illustrating an example of the optical module in a case where a Si-Ph chip is displaced toward a lower surface side according to Embodiment 2.

As illustrated in FIG. 7, the cutout portion 112c is formed at, for example, a substantially middle portion between the upper surface and the lower surface of the substrate 110. The cutout portion 112c is not limited thereto, and may be formed in, for example, a portion closer to the upper surface of the substrate 110 than to the lower surface of the substrate 110. The deformation portion 113b is thus displaced toward the lower surface side with ease. FIG. 8 is a sectional view illustrating an example of the optical module in a case where the Si-Ph chip is displaced toward the lower surface side according to Embodiment 2. FIG. 8 illustrates, for example, an example of a case where a cross-section of the optical module 100 taken along line B-B in FIG. 5 is seen from the lower side toward the upper side in FIG. 5 with the Si-Ph chip 120 displaced toward the lower surface side. FIG. 8 also illustrates, for example, an example of a cross-section of the optical module 100 after the adhesive 303 on the lower surface of the Si-Ph chip 120 is cured. In FIG. 8, the same reference numerals are given to the same configurations as those in FIG. 7, and the description thereof will be omitted.

As described above, in the optical module 100 according to Embodiment 2, the cutout portion 112c is provided in the substrate 110, so that the deformation portion 113b is displaced toward the lower surface side with ease. As illustrated in FIG. 8, the deformation portion 113b is therefore displaced such that the deformation portion 113b is bent toward the lower surface side so as to follow the displacement of the Si-Ph chip 120 toward the lower surface side. Further, the force indicated by the arrow 330 in FIG. 3 is reduced by an amount of the displacement of the deformation portion 113b toward the lower surface side. The optical module 100 according to Embodiment 2 thus relieves stress generated at the control chip 130 when the Si-Ph chip 120 is displaced toward the lower surface side, and therefore suppresses damage to the control chip 130 due to this stress.

Also in the optical module 100 according to Embodiment 2, when the deformation portion 113b is displaced toward the lower surface side, a part of the displaced deformation portion 113b comes into contact with a portion 801, on the lower surface side, of the deformation portion 113b of the substrate 110 in some instances. In the case where the part of the displaced deformation portion 113b is in contact with the portion 801, force (drag) directed to the upper surface side is applied to a portion, adjoining the portion 801, of the deformation portion 113b. As illustrated in FIG. 8, in the optical module 100 according to Embodiment 2, the portion, to which the control chip 130 is bonded, of the deformation portion 113b is thus made horizontal. The optical module 100 according to Embodiment 2 therefore suppresses separation of the bump-bonding by the bump Bp1, the separation being caused since the portion, to which the control chip 130 is bonded, of the substrate 110 is inclined relative to the control chip 130.

As described above, in the optical module 100 according to Embodiment 2, the deformation portion 113b to which the control chip 130 is bonded is displaced toward the lower surface side of the substrate 110 with ease in such a manner that the cutout portion 112c is provided in the substrate 110 so as to communicate with the through hole 111. The optical module 100 according to Embodiment 2 thus produces similar effects to those of the optical module 100 according to Embodiment 1.

Embodiment 3

With respect to Embodiment 3, portions different from those in Embodiment 1 and Embodiment 2 will be described. Embodiment 3 to be described below is an example of a case where the cutout portions 112a and 112b as well as the cutout portion 112c are provided as cutout portions in the substrate 110.

Example of Optical Module According to Embodiment 3

Figure 9:
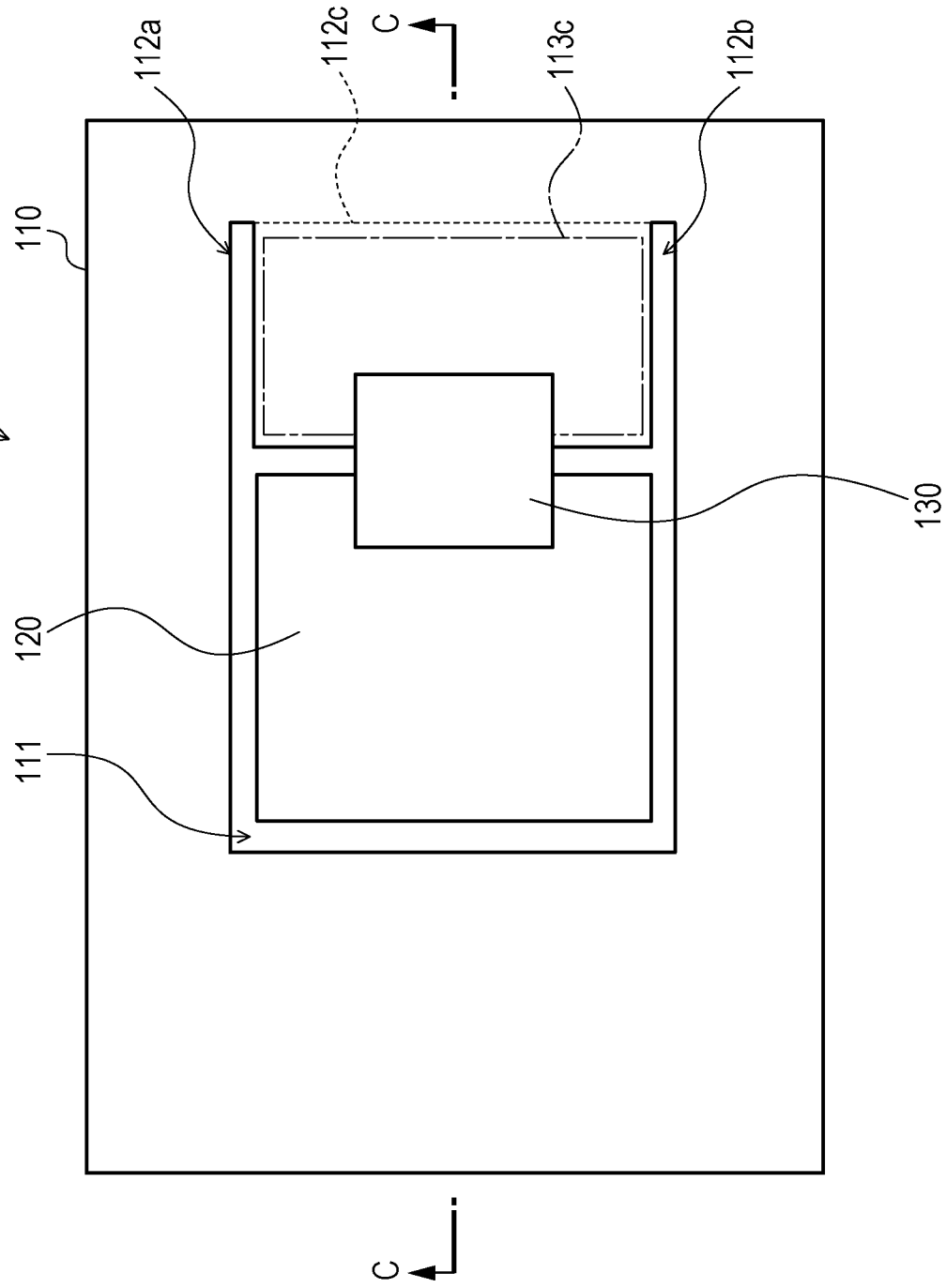
FIG. 9 is a top view illustrating an example of an optical module according to Embodiment 3.

FIG. 9 is a top view illustrating an example of the optical module according to Embodiment 3. In FIG. 9, the same reference numerals are given to the same configurations as those in FIG. 1 and FIG. 5, and the description thereof is omitted. In the optical module 100 according to Embodiment 3 illustrated in FIG. 9, the substrate 110 is provided with the cutout portion 112a, the cutout portion 112b, and the cutout portion 112c. In the case of providing the cutout portions 112a to 112c, preferably, the cutout portion 112a and the cutout portion 112b do not penetrate from the upper surface to the lower surface of the substrate 110, but may penetrate from the upper surface to the cutout portion 112c of the substrate 110.

By providing the cutout portions 112a to 112c in the substrate 110, a deformation portion 113c of the substrate 110 is displaced toward the lower surface side with ease. The deformation portion 113c is a portion of the substrate 110 sandwiched between the cutout portion 112a and the cutout portion 112b and corresponding to the upper surface side of the cutout portion 112c. Further, the deformation portion 113c includes the portion, to which the control chip 130 is bonded, of the substrate 110. For example, the cutout portions 112a to 112c may be provided such that the deformation portion 113c includes the portion, to which the control chip 130 is bonded, of the substrate 110.

For example, the substrate 110 according to Embodiment 3 may be realized by forming the through hole 111 and the cutout portions 112a and 112b by cutting using cutting means in an insulator base material on which an electronic component such as an integrated circuit is provided, and forming the cutout portion 112c by cutting from the side of the cut through hole 111.

Figure 10:
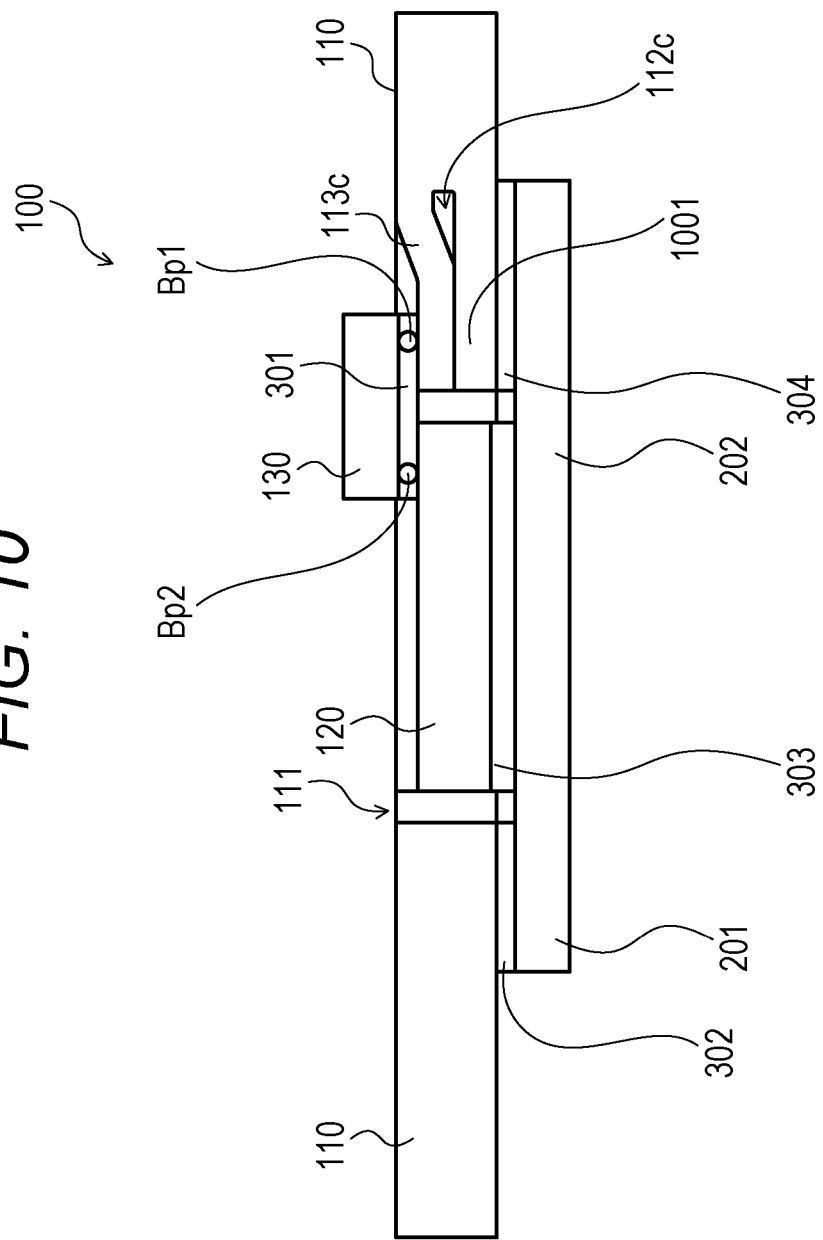
FIG. 10 is a sectional view illustrating an example of the optical module in a case where a Si-Ph chip is displaced toward a lower surface side according to Embodiment 3.

FIG. 10 is a sectional view illustrating an example of the optical module in a case where the Si-Ph chip is displaced toward the lower surface side according to Embodiment 3. FIG. 10 illustrates, for example, an example of a case where a cross-section of the optical module 100 taken along line C-C in FIG. 9 is seen from the lower side toward the upper side in FIG. 9 with the Si-Ph chip 120 displaced toward the lower surface side. FIG. 10 also illustrates, for example, an example of a cross-section of the optical module 100 after the adhesive 303 on the lower surface of the Si-Ph chip 120 is cured. In FIG. 10, the same reference numerals are given to the same configurations as those in FIG. 8 and FIG. 9, and the description thereof is omitted.

As described above, in the optical module 100 according to Embodiment 3, the cutout portions 112a to 112c are provided in the substrate 110, so that the deformation portion 113c is displaced toward the lower surface side with ease. In the optical module 100 according to Embodiment 3, as illustrated in FIG. 10, the deformation portion 113c is therefore displaced such that the deformation portion 113c is bent toward the lower surface side so as to follow the displacement of the Si-Ph chip 120 toward the lower surface side. Further, by displacing the deformation portion 113c toward the lower surface side, the optical module 100 according to Embodiment 3 reduces drag to be applied from the substrate 110 to the control chip 130 when the Si-Ph chip 120 is displaced toward the lower surface side. The optical module 100 according to Embodiment 3 thus relieves stress generated at the control chip 130 when the Si-Ph chip 120 is displaced toward the lower surface side, and therefore suppresses damage to the control chip 130 due to this stress.

Also in the optical module 100 according to Embodiment 3, as illustrated in FIG. 10, in the case where the deformation portion 113c is displaced toward the lower surface side, a lower surface of a portion, to which the control chip 130 is bonded, of the displaced deformation portion 113c comes into contact with a portion 1001 of the substrate 110. The portion 1001 is a portion of the substrate 110 facing the deformation portion 113c across the cutout portion 112c. In the case where the lower surface of the portion, to which the control chip 130 is bonded, of the displaced deformation portion 113c is in contact with the portion 1001, force (drag) directed to the upper surface side is applied to the portion, to which the control chip 130 is bonded, of the displaced deformation portion 113c. As illustrated in FIG. 10, in the optical module 100 according to Embodiment 3, the portion, to which the control chip 130 is bonded, of the deformation portion 113c is thus made horizontal in such a manner that the portion, to which the control chip 130 is bonded, of the deformation portion 113c is displaced toward the upper surface side. The optical module 100 according to Embodiment 3 therefore suppresses separation of the bump-bonding by the bump Bp1, the separation being caused since the portion, to which the control chip 130 is bonded, of the substrate 110 is inclined relative to the control chip 130.

As described above, in the optical module 100 according to Embodiment 3, the substrate 110 is provided with the cutout portions 112a and 112b as well as the cutout portion 112c. The optical module 100 according to Embodiment 3 therefore produces similar advantageous effects to those of the optical modules 100 according to Embodiments 1 and 2, and further suppresses damage to the circuit such as the control chip 130 since the portion, to which the control chip 130 is bonded, of the substrate 110 is further displaced with ease.

Embodiment 4

With respect to Embodiment 4, portions different from those in Embodiments 1 to 3 will be described. Embodiment 4 to be described below is an example of a case where a groove is provided in the substrate 110 to allow the deformation portion 113c to be displaced with ease.

Example of Optical Module According to Embodiment 4

Figure 11:
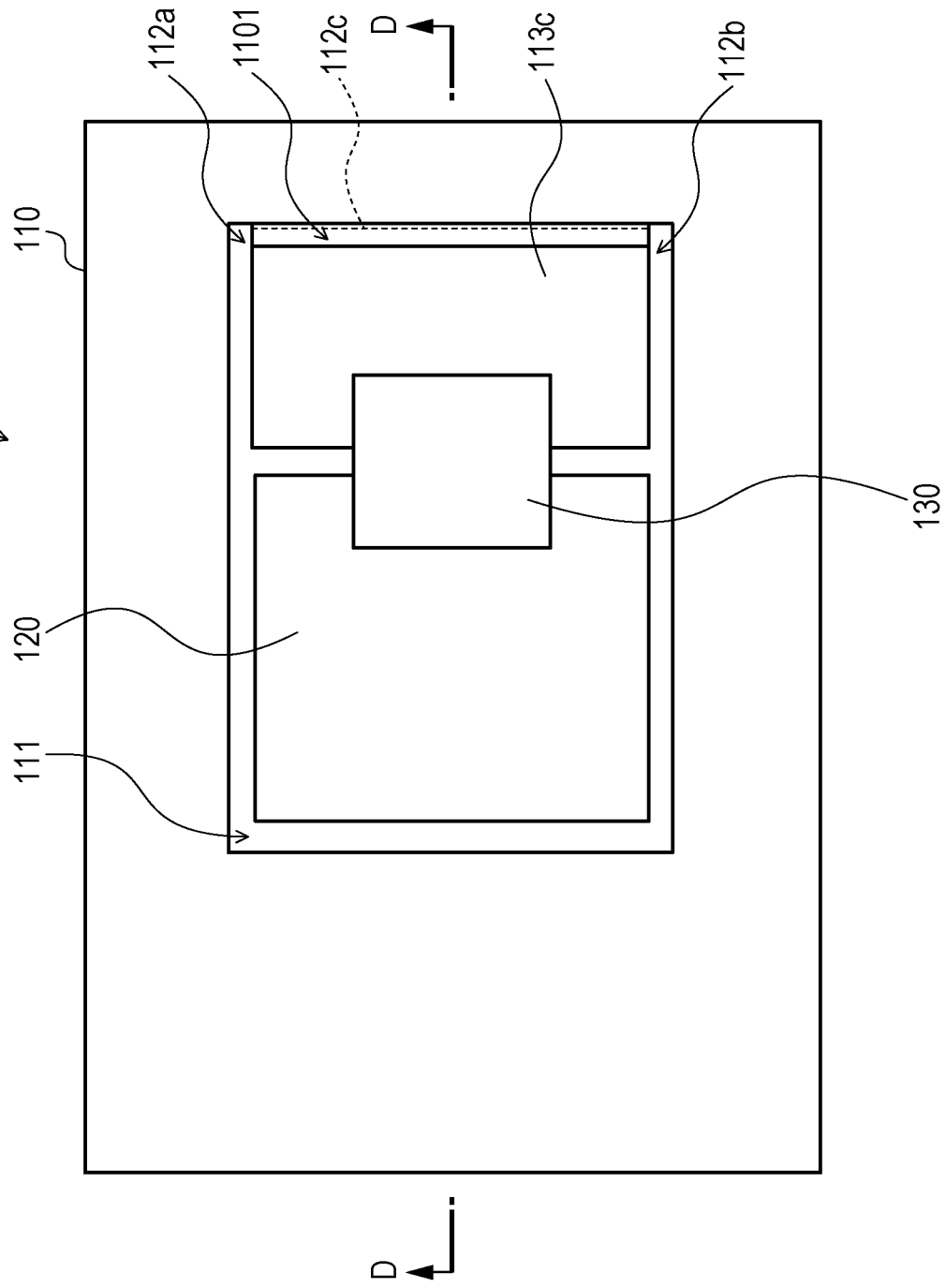
FIG. 11 is a top view illustrating an example of an optical module according to Embodiment 4.

FIG. 11 is a top view illustrating an example of the optical module according to Embodiment 4. In FIG. 11, the same reference numerals are given to the same configurations as those in FIG. 9, and the description thereof will be omitted. In the optical module 100 according to Embodiment 4 illustrated in FIG. 11, a groove 1101 is provided in the upper surface of the substrate 110. The groove 1101 is provided in the deformation portion 113c on the side opposite to the portion, to which the control chip 130 is bonded, of the substrate 110. In the example illustrated in FIG. 11, the groove 1101 is provided between an end portion of the cutout portion 112a opposite to the through hole 111 and an end portion of the cutout portion 112b opposite to the through hole 111.

Figure 12:
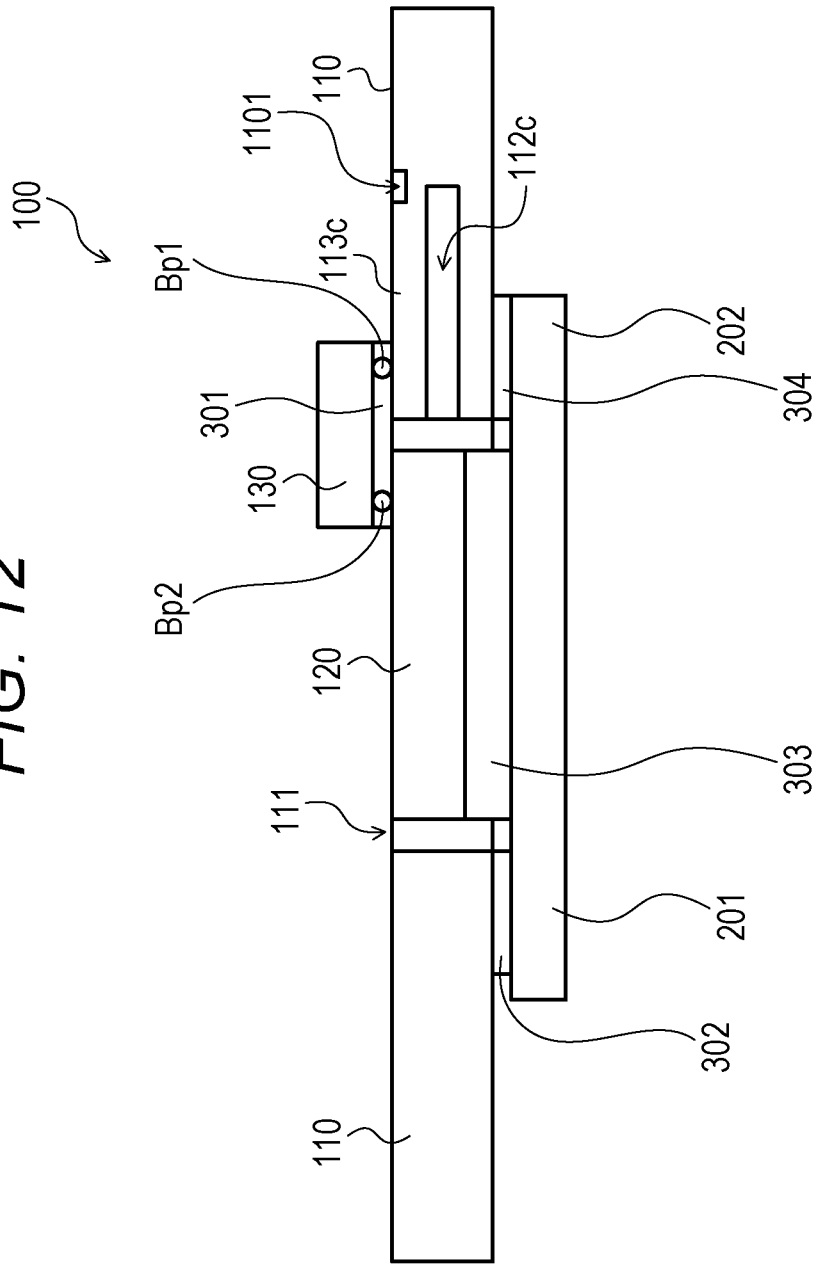
FIG. 12 is a sectional view illustrating an example of the optical module according to Embodiment 4.

FIG. 12 is a sectional view illustrating an example of the optical module according to Embodiment 4. FIG. 12 illustrates an example of a case where a cross-section of the optical module 100 taken along line D-D in FIG. 11 is seen from the lower side toward the upper side in FIG. 11. FIG. 12 also illustrates, for example, an example of a cross-section of the optical module 100 before the adhesive 303 on the lower surface of the Si-Ph chip 120 is cured. In FIG. 12, the same reference numerals are given to the same configurations as those in FIG. 10 and FIG. 11, and the description thereof is omitted.

As illustrated in FIG. 12, the groove 1101 is provided by cutting out the substrate 110 from the upper surface of the substrate 110 to a substantially middle portion between the upper surface and the lower surface of the substrate 110, for example. A section modulus of the deformation portion 113c in displacing the deformation portion 113c toward the lower surface side in the case of providing the groove 1101 is smaller than a section modulus of the deformation portion 113c in displacing the deformation portion 113c toward the lower surface side in a case of not providing the groove 1101. By providing the groove 1101, the deformation portion 113c including the portion, to which the control chip 130 is bonded, of the substrate 110 is displaced toward the lower surface side with ease, in accordance with the control chip 130-side force to be applied to the portion, to which the control chip 130 is bonded, of the substrate 110. Further, the groove 1101 may be provided by cutting out the substrate 110 from the upper surface of the substrate 110 to a portion of the substrate 110 closer to the lower surface of the substrate 110 than to the upper surface of the substrate 110, for example.

As described above, in the optical module 100 according to Embodiment 4, as in a manner similar to that of the optical module 100 according to Embodiment 3, the deformation portion 113c is displaced such that the deformation portion 113c is bent so as to follow the displacement of the Si-Ph chip 120 toward the lower surface side. Further, by displacing the deformation portion 113c toward the lower surface side, the optical module 100 according to Embodiment 4 reduces drag to be applied from the substrate 110 to the control chip 130 when the Si-Ph chip 120 is displaced toward the lower surface side. The optical module 100 according to Embodiment 4 thus relieves stress generated at the control chip 130 when the Si-Ph chip 120 is displaced toward the lower surface side, and therefore suppresses damage to the control chip 130 due to this stress.

As described above, in the optical module 100 according to Embodiment 4, the substrate 110 is provided with, in addition to the cutout portions, the groove 1101 in the upper surface at the position opposite to the through hole 111 as seen from the portion, to which the control chip 130 is bonded, of the substrate 110. The optical module 100 according to Embodiment 4 therefore produces similar effects to those of the optical modules 100 according to Embodiments 1 to 3, and suppresses damage to the circuit such as the control chip 130 since the portion, to which the control chip 130 is bonded, of the substrate 110 is further displaced with ease.

For example, the substrate 110 according to Embodiment 4 may be realized by forming the through hole 111, the cutout portions 112a and 112b, and the groove 1101 by cutting using cutting means in an insulator base material on which an electronic component such as an integrated circuit is provided, and forming the cutout portion 112c by cutting from the side of the cut through hole 111.

In the example described above, the groove 1101 is provided in the deformation portion 113c of the optical module 100 having the cutout portions 112a to 112c, but is not limited thereto. For example, the groove 1101 may be provided in the deformation portion 113a of the optical module 100 having only the cutout portions 112a and 112b.

Embodiment 5

With respect to Embodiment 5, portions different from those in Embodiment 4 will be described. Embodiment 5 to be described below is an example of a case where a groove is provided between the groove 1101 and the portion, to which the control chip 130 is bonded, of the substrate 110 to allow the portion, to which the control chip 130 is bonded, of the substrate 110 to be displaced toward the upper surface side with ease.

Example of Optical Module According to Embodiment 5

Figure 13:
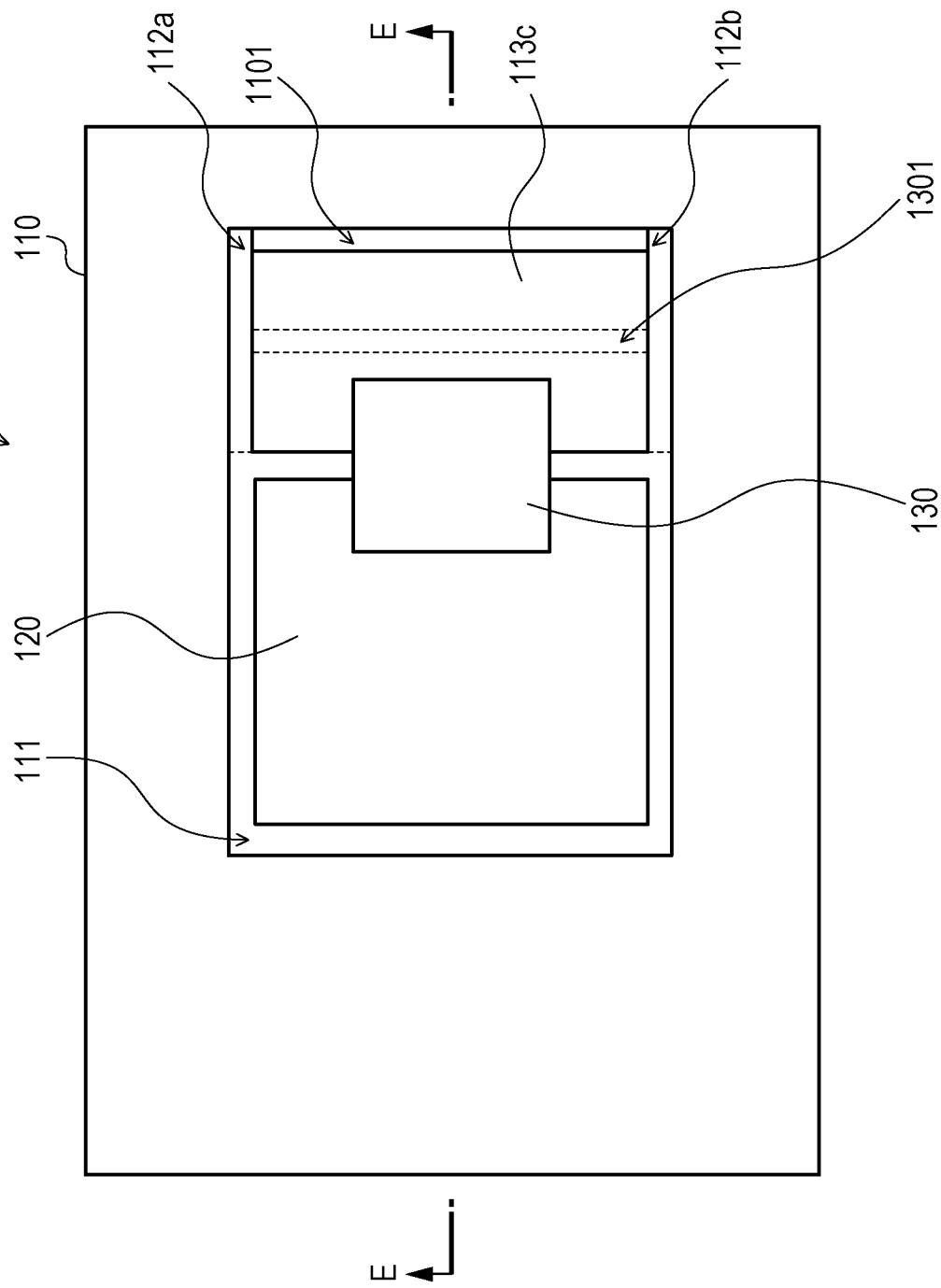
FIG. 13 is a top view illustrating an example of an optical module according to Embodiment 5.

FIG. 13 is a top view illustrating an example of the optical module according to Embodiment 5. In FIG. 13, the same reference numerals are given to the same configurations as those in FIG. 11, and the description thereof will be omitted. In the optical module 100 according to Embodiment 5 illustrated in FIG. 13, a groove 1301 is provided in the substrate 110. The groove 1301 is provided between the groove 1101 and the portion, to which the control chip 130 is bonded, of the substrate 110, in the deformation portion 113c. In the example illustrated in FIG. 13, the groove 1301 is provided at a substantially middle position between the groove 1101 and the portion, to which the control chip 130 is bonded, of the substrate 110. Further, as will be described later, the groove 1301 is provided in the lower surface of the deformation portion 113c.

Figure 14:
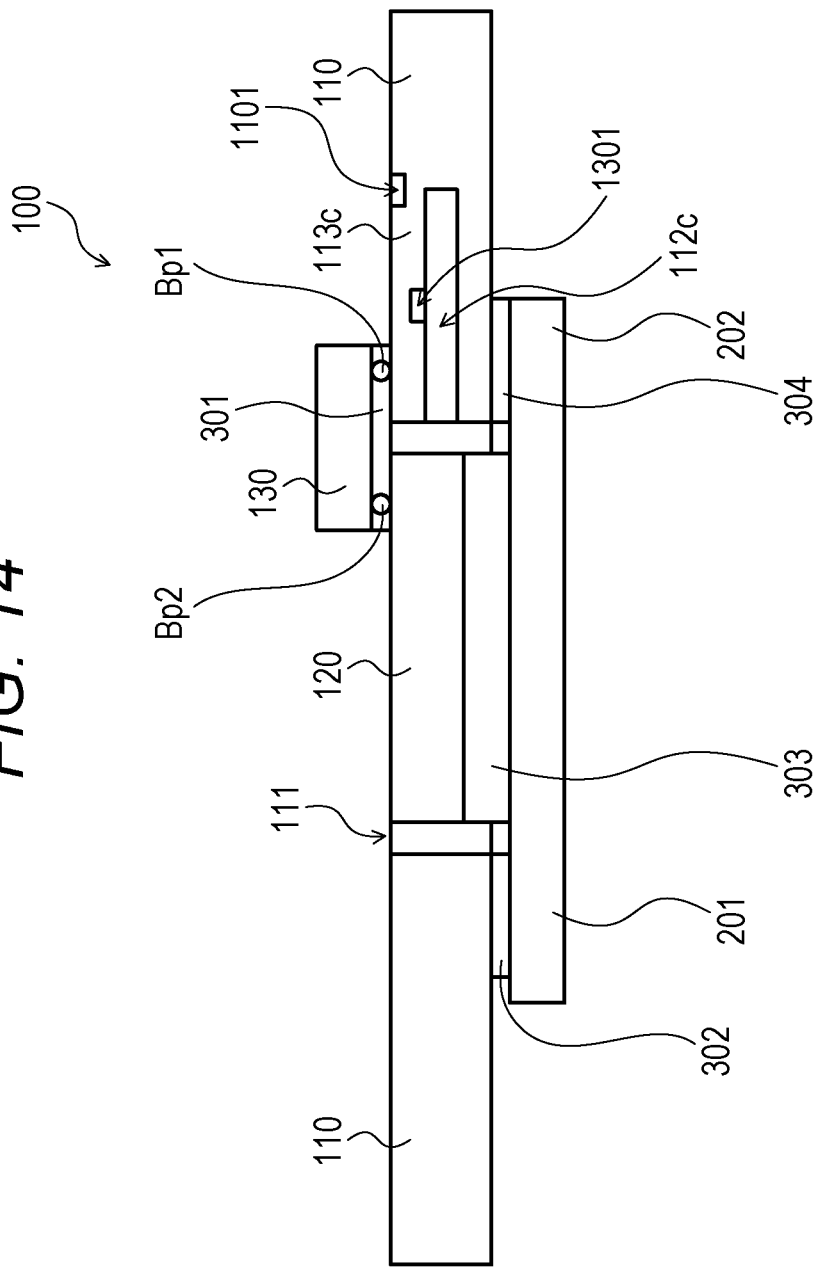
FIG. 14 is a sectional view illustrating an example of the optical module according to Embodiment 5.

FIG. 14 is a sectional view illustrating an example of the optical module according to Embodiment 5. FIG. 14 illustrates, for example, an example of a case where a cross-section of the optical module 100 taken along line E-E in FIG. 13 is seen from the lower side toward the upper side in FIG. 13. FIG. 14 also illustrates, for example, an example of a cross-section of the optical module 100 before the adhesive 303 on the lower surface of the Si-Ph chip 120 is cured. In FIG. 14, the same reference numerals are given to the same configurations as those in FIG. 10 and FIG. 13, and the description thereof is omitted.

As illustrated in FIG. 14, the groove 1301 is formed by cutting out the substrate 110 from the lower surface of the deformation portion 113c to a substantially middle portion between the upper surface and the lower surface of the deformation portion 113c, for example. Further, the groove 1301 is not limited thereto, and may be formed by cutting out the substrate 110 to a portion closer to the upper surface of the deformation portion 113c than to the lower surface of the deformation portion 113c, for example.

Figure 15:
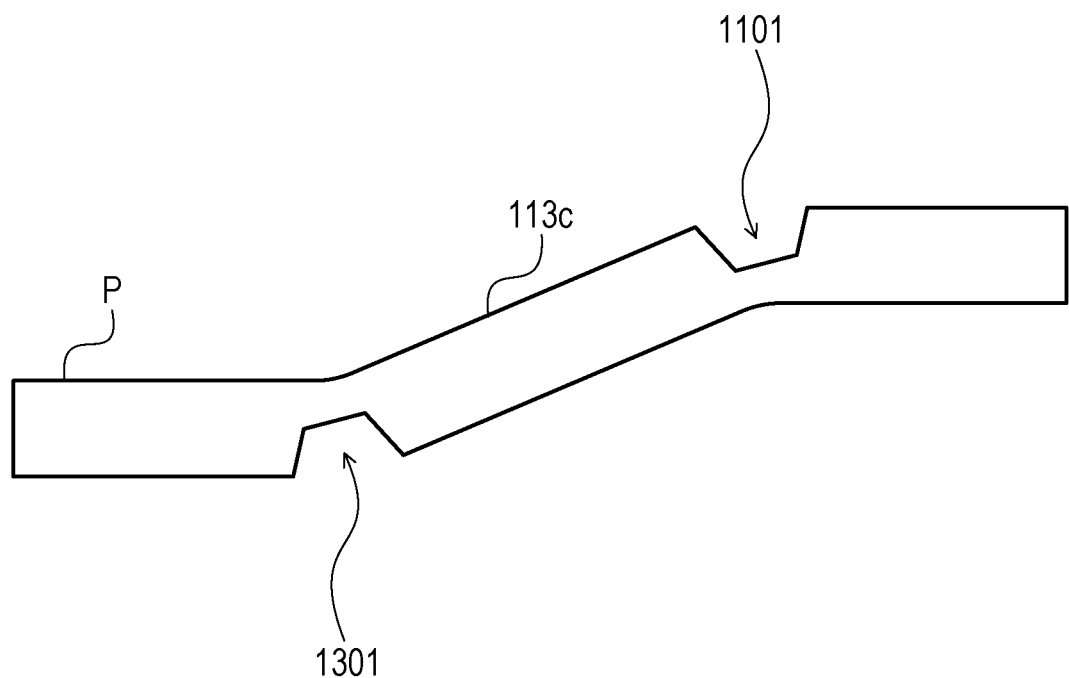
FIG. 15 is a sectional view illustrating an example of a deformation portion in a case where a Si-Ph chip is displaced toward a lower surface side according to Embodiment 5.

FIG. 15 is a sectional view illustrating an example of the deformation portion in a case where the Si-Ph chip is displaced toward the lower surface side according to Embodiment 5. FIG. 15 illustrates an example of a cross-section of the deformation portion 113c in the case where the Si-Ph chip 120 is displaced toward the lower surface side. In FIG. 15, the same reference numerals are given to the same configurations as those in FIG. 14, and the description thereof will be omitted.

As illustrated in FIG. 15, the deformation portion 113c is deformed such that a portion of the groove 1101 closer to the upper surface of the deformation portion 113c widens. As illustrated in FIG. 15, the deformation portion 113c is deformed such that a portion of the groove 1301 closer to the lower surface of the deformation portion 113c widens. In the case of providing the groove 1101 and the groove 1301, as illustrated in FIG. 15, even when the deformation portion 113c is deformed, an upper surface of a portion P, to which the control chip 130 is bonded, of the deformation portion 113c is made substantially parallel with, for example, the upper surface of the Si-Ph chip 120. The optical module 100 according to Embodiment 5 thus relieves stress to be generated at the control chip 130 since the upper surface of the portion P, to which the control chip 130 is bonded, of the deformation portion 113c is not parallel with the upper surface of the Si-Ph chip 120.

As described above, in the optical module 100 according to Embodiment 5, the groove 1301 is provided between the groove 1101 and the portion, to which the control chip 130 is bonded, of the substrate 110. The optical module 100 according to Embodiment 5 therefore produces similar advantageous effects to those of the optical module 100 according to Embodiment 3, and keeps the upper surface of the portion, to which the control chip 130 is bonded, of the substrate 110 and the upper surface of the Si-Ph chip 120 substantially parallel with each other even when the Si-Ph chip 120 is displaced toward the lower surface side. The optical module 100 according to Embodiment 5 thus suppresses damage to the circuit such as the control chip 130.

For example, the substrate 110 according to Embodiment 5 may be realized by forming the through hole 111, the cutout portions 112a and 112b, and the groove 1101 by cutting using cutting means in an insulator base material on which an electronic component is provided, and forming the cutout portion 112c and the groove 1301 by cutting from the side of the cut through hole 111.

Embodiment 6

With respect to Embodiment 6, portions different from those in Embodiments 1 to 5 will be described. Embodiment 6 to be described below is an example of a case where a region including the portion, to which the control chip 130 is bonded, of the substrate 110 is formed to be thinner than the other region of the substrate 110.

Example of Optical Module According to Embodiment 6

Figure 16:
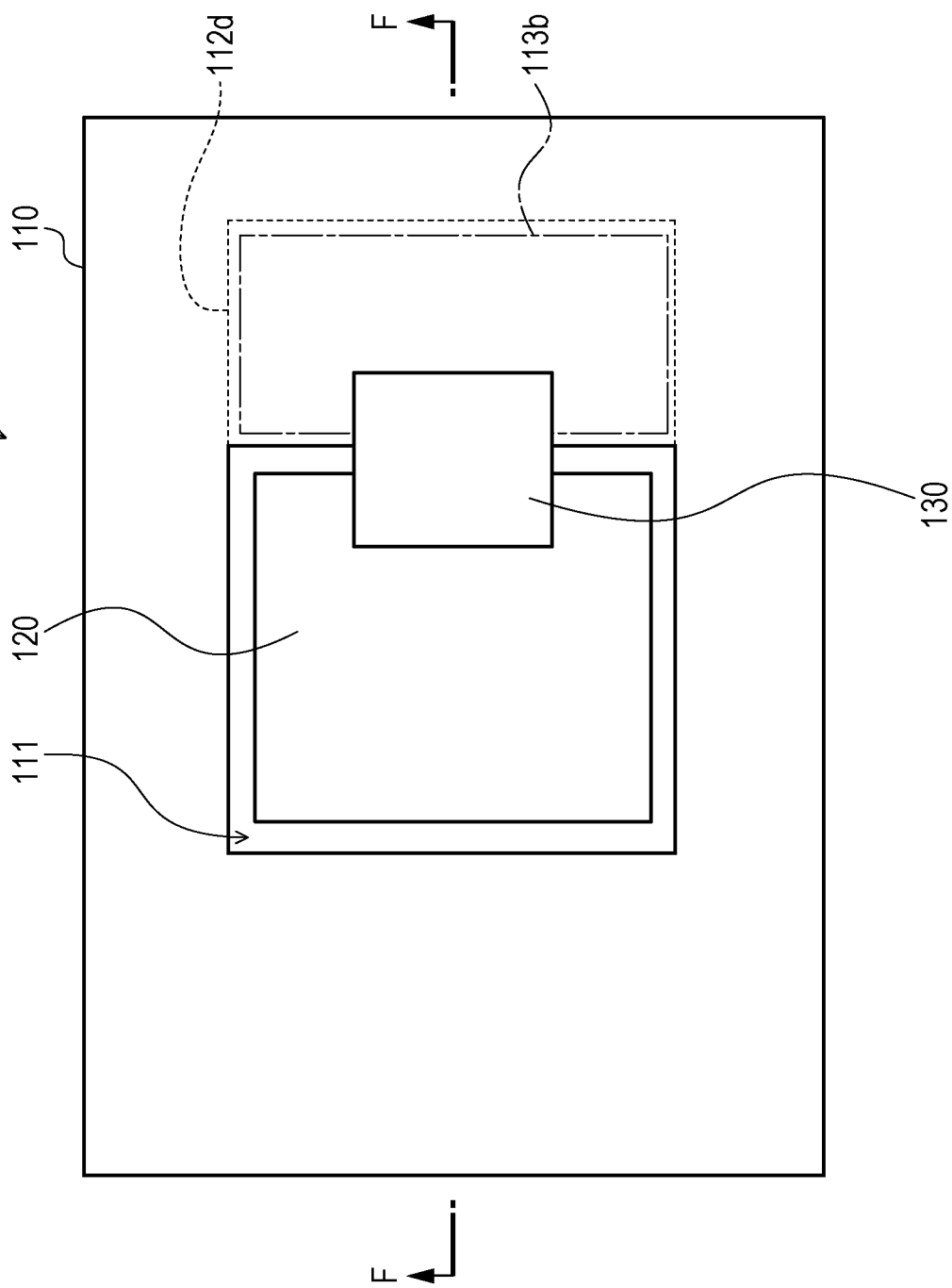
FIG. 16 is a top view illustrating an example of an optical module according to Embodiment 6.

FIG. 16 is a top view illustrating an example of the optical module according to Embodiment 6. In FIG. 16, the same reference numerals are given to the same configurations as those in FIG. 5, and the description thereof will be omitted. In the optical module 100 according to Embodiment 6 illustrated in FIG. 16, the substrate 110 is provided with a cutout portion 112d.

The cutout portion 112d is provided in a lower surface of the portion, to which the control chip 130 is bonded, of the lower surface of the substrate 110. For example, the cutout portion 112d may be a counterbore provided in a lower surface side of the portion, to which the control chip 130 is bonded, of the lower surface of the substrate 110. In the example illustrated in FIG. 16, the cutout portion 112d is almost equal in width to the through hole 111 in a vertical direction of FIG. 16, and is provided to extend rightward in FIG. 16, from the through hole 111. By providing the cutout portion 112d, as in a manner similar to that in the case of providing the cutout portion 112c, the deformation portion 113b including the portion, to which the control chip 130 is bonded, of the substrate 110 is thinner than the region, other than the deformation portion 113b, of the substrate 110. By providing the cutout portion 112d, as in a manner similar to that in the case of providing the cutout portion 112c, the deformation portion 113b is therefore displaced toward the lower surface side with ease.

Figure 17:
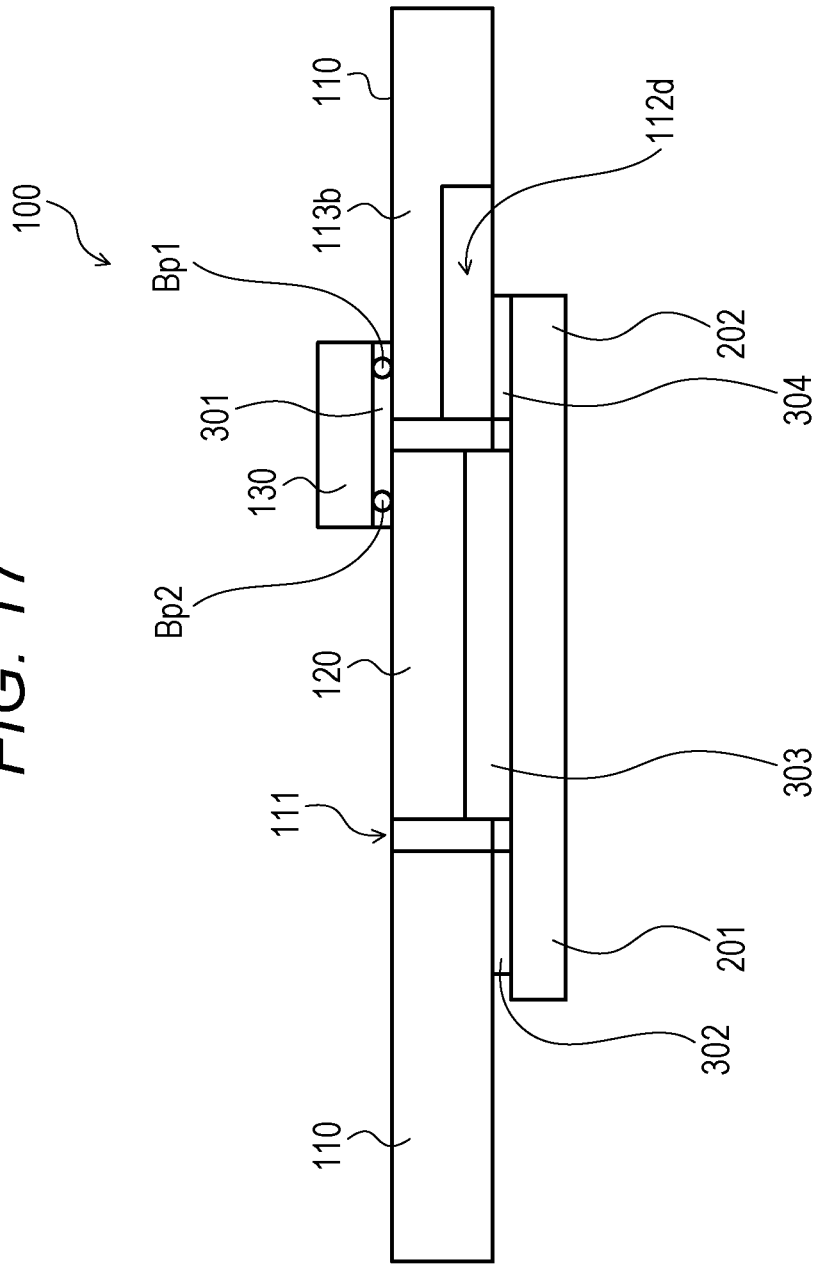
FIG. 17 is a sectional view illustrating an example of the optical module according to Embodiment 6.

FIG. 17 is a sectional view illustrating an example of the optical module according to Embodiment 6. FIG. 17 illustrates an example of a case where a cross-section of the optical module 100 taken along line F-F in FIG. 16 is seen from the lower side toward the upper side in FIG. 16. FIG. 17 also illustrates, for example, an example of a cross-section of the optical module 100 before the adhesive 303 on the lower surface of the Si-Ph chip 120 is cured. In FIG. 17, the same reference numerals are given to the same configurations as those in FIG. 3 and FIG. 16, and the description thereof is omitted.

As illustrated in FIG. 17, the cutout portion 112d is formed by cutting out the substrate 110 from the lower surface of the substrate 110 to a substantially middle portion between the upper surface and the lower surface of the substrate 110, for example. Further, the cutout portion 112d is not limited thereto, and may be provided by cutting out the substrate 110 from the lower surface of the substrate 110 to a portion of the substrate 110 closer to the upper surface of the substrate 110 than to the lower surface of the substrate 110, for example. By providing the cutout portion 112d, as in a manner similar to that in the case of providing the cutout portion 112c, the deformation portion 113b is displaced toward the lower surface side with ease.

As described above, in the optical module 100 according to Embodiment 6, the region including the portion, to which the control chip 130 is bonded, of the substrate 110 is formed to be thinner than the other region of the substrate 110 in such a manner that the cutout portion 112d is provided to communicate with the through hole 111. The optical module 100 according to Embodiment 6 thus produces, for example, similar advantageous effects to those of the optical module 100 according to Embodiment 3. The optical module 100 according to Embodiment 6 may be provided with the groove 1101 described in Embodiment 4 or the groove 1301 described in Embodiment 5.

Embodiment 7

With respect to Embodiment 7, portions different from those in Embodiment 6 will be described. Embodiment 7 to be described below is an example of a case where the substrate 110 of the optical module 100 according to Embodiment 6 is provided with the cutout portions 112a and 112b.

Example of Optical Module According to Embodiment 7

FIG. 18 is a top view illustrating an example of the optical module according to Embodiment 7. In FIG. 18, the same reference numerals are given to the same configurations as those in FIG. 9 and FIG. 16, and the description thereof is omitted. The substrate 110 of the optical module 100 according to Embodiment 7 illustrated in FIG. 18 is provided with the cutout portion 112a, the cutout portion 112b, and the cutout portion 112d. By providing the cutout portions 112a, 112b, and 112d in the substrate 110, as in a manner similar to that of the case of providing the cutout portions 112a to 112c in the substrate 110, the deformation portion 113b is displaced toward the lower surface side with ease.

Further, although illustration and detailed description are omitted, the optical module 100 illustrated in FIG. 18 may be provided with the groove 1101 as in a manner similar to that in the example illustrated in, for example, FIG. 11. Further, the optical module 100 illustrated in FIG. 18 may also be provided with the groove 1301 as in a manner similar to that in the example illustrated in, for example, FIG. 13.

As described above, in the optical module 100 according to Embodiment 7, the substrate 110 is provided with the cutout portions 112a and 112b as well as the cutout portion 112d. The optical module 100 according to Embodiment 7 therefore produces similar advantageous effects to those of the optical modules 100 according to Embodiments 1 and 6, and further suppresses damage to the circuit such as the control chip 130 since the portion, to which the control chip 130 is bonded, of the substrate 110 is further displaced with ease.

As described above, the embodiments discussed herein enable suppression of damage to a circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
   a substrate including a through hole;
   a first chip including a first heating member and disposed in the through hole;
   a second chip including a second heating member, disposed in such a manner that the second chip is across a part of the through hole between a sidewall of the first chip and a sidewall of the substrate and bonded to a first upper surface of the substrate and a second upper surface of the first chip via bumps; and
   a first heat sink adhered to a lower surface of the substrate with a first adhesive and adhered to a lower surface of the first chip with a second adhesive,
   the substrate includes a slit which is provided in a first portion on an opposite side to the first chip with respect to the part of the through hole and extends in a direction of the opposite side from the part of the through hole.

2. The optical module according to claim 1, wherein the slit includes a first slit and a second slit which each communicates with respective ends of the part of the through hole and are formed on both sides of the first portion of the substrate, respectively.

3. The optical module according to claim 1, wherein the slit includes a slit which is provided between the upper surface of the substrate and the lower surface of the substrate, and communicates with the part of the through hole.

4. The optical module according to claim 1, wherein the substrate is provided with a first groove in the first upper surface at a position on the opposite side to the first chip with respect to the part of the through hole.

5. The optical module according to claim 4, wherein the substrate is provided with a second groove opposite in a direction to the first groove, in a second portion between the first groove and the part of the through hole.

6. The optical module according to claim 1, wherein the first heat sink is provided on a lower surface of a third portion of the substrate, the third portion being different from the first portion of the substrate.

7. The optical module according to claim 6, further comprising a second heat sink disposed on a lower surface of the first portion of the substrate, the second heat sink being different from the first heat sink.

8. An optical module comprising:
   a substrate including a through hole;
   a first chip including a first heating member and disposed in the through hole;
   a second chip including a second heating member, disposed in such a manner that the second chip is across a part of the through hole between a sidewall of the first chip and a sidewall of the substrate and bonded to a first upper surface of the substrate and a second upper surface of the first chip via bumps; and
   a heat sink adhered to a lower surface of the substrate with a first adhesive and adhered to a lower surface of the first chip with a second adhesive,
   the substrate includes a first region which underlies the second chip and is located the substrate is formed to be thinner underlies the second chip and is located adjacent to the part of the through hole has a thinner thickness than a second region different from the first region of the substrate and a cutout portion between the first region and an upper surface of the heat sink.

9. The optical module according to claim 8, wherein the substrate is provided with a first groove in the first upper surface at a position on the opposite side to the first chip with respect to the part of the through hole.

10. The optical module according to claim 9, wherein the substrate is provided with a second groove opposite in a direction to the first groove, in a second portion between the first groove and the part of the through hole.

* * * * *